US006545552B2

(12) United States Patent
Kim et al.

(10) Patent No.: US 6,545,552 B2
(45) Date of Patent: Apr. 8, 2003

(54) LOCAL OSCILLATOR USING NON-RADIATIVE DIELECTRIC WAVEGUIDE

(75) Inventors: Young Su Kim, Ulsan (KR); Young Geun Yoo, Ulsan (KR)

(73) Assignee: NRD Co., Ltd. (KR)

( * ) Notice: Subject to any disclaimer, the term of this patent is extended or adjusted under 35 U.S.C. 154(b) by 82 days.

(21) Appl. No.: 09/847,752

(22) Filed: May 2, 2001

(65) Prior Publication Data

US 2002/0093386 A1 Jul. 18, 2002

(30) Foreign Application Priority Data

Jan. 15, 2001 (KR) .......................................... 2001-2117

(51) Int. Cl.[7] .............................. H03B 1/00; H03B 7/14
(52) U.S. Cl. .................... 331/68; 331/96; 331/107 DP; 331/107 G
(58) Field of Search ................................. 331/96, 36 C, 331/68, 107 SL, 107 DP, 107 G

(56) References Cited

U.S. PATENT DOCUMENTS 6,344,779 B1 * 2/2002 Haruta et al. ................. 331/96

FOREIGN PATENT DOCUMENTS

JP          09083205 A  *  3/1997 ............. H01P/1/15
JP          09083216 A  *  3/1997 ............. H01P/3/16
JP          09326639 A  * 12/1997 ............. H03B/9/14

* cited by examiner

Primary Examiner—Robert Pascal
Assistant Examiner—Kimberly Glenn
(74) Attorney, Agent, or Firm—Ostrolenk, Faber, Gerb & Soffen, LLP

(57) ABSTRACT

Disclosed is a local oscillator utilizing an NRD guide applicable to a millimeter wave integrated circuits. A Gunn diode is buried in a bottom of a housing so that a heat generated from the Gunn diode is directly transferred to the housing and is rapidly emitted. Thus, an oscillating power and an oscillating frequency obtained from the local oscillator can be stabilized due to efficient heat-emission. Since a diode mount is not required, manufacturing costs can be reduced while productivity increases. A metal rod resonator, which is easily assembled and has good power and frequency stability as compared with a microstrip resonator, is used as a resonating device. The metal rod resonator is inserted into a fixing block in perpendicular to the NRD guide. An end of the metal rod resonator directly makes contact with an anode of the gun diode. A cavity forming member for defining a cavity, which surrounds main components including the Gunn diode, is installed in the housing. A local oscillator module can be protected and the oscillating power and the oscillating frequency can be stably maintained under a frequency band satisfying a cavity condition.

16 Claims, 31 Drawing Sheets

BEFORE ASSEMBLING

AFTER ASSEMBLING

BEFORE ASSEMBLING 108 104 118

AFTER ASSEMBLING 108  118

BEFORE ASSEMBLING

AFTER ASSEMBLING 103
102

LOCAL OSCILLATOR USING NON-RADIATIVE DIELECTRIC WAVEGUIDE

TECHNICAL FIELD OF THE INVENTION

The present invention relates to a local oscillator for millimeter wave, and more particularly, to a local oscillator utilizing a non-radiative dielectric waveguide (hereinafter referred to "NRD guide") which can be used in millimeter wave integrated circuits.

BACKGROUND OF THE INVENTION

An NRD guide circuit has been widely used as a transmission line for a millimeter wave band above 30 GHz as it has a low transmission loss and can be easily fabricated as compared with a conventional microstrip line. The NRD guide circuit has a structure that a dielectric line along which an electromagnetic wave is transmitted is installed between two parallel conductive plates. A distance between the two parallel plates is smaller than half a wavelength of a using signal. Accordingly, the electromagnetic wave is shielded by the two parallel conductive plates not to pass through them, so that the electromagnetic wave can be transmitted along the dielectric line with a low transmission loss. Based on such a good transmission feature of the NRD guide circuit, local oscillators of 35 GHz and 60 GHZ, which are constructed by combining a Gunn diode and the NRD guide circuit, have been suggested.

FIGS. 1 to 3 show a conventional millimeter wave local oscillator. Referring to FIGS. 1 to 3, an NRD guide 8 is installed between upper and lower parallel conductive plates 11a and 11b in such a manner that an antenna portion 10 which is an output portion of the NRD guide 8 is protruded to an exterior. A diode mount 21, on which a Gunn diode 1 and a bias choke 22 are mounted, is parallel arranged near to an input terminal of the NRD guide 8. In order to form a longitudinal-section magnetic (LSM) mode in the NRD guide 8, a microstrip resonator 23 is transversely coupled to the input terminal of the NRD guide 8 in such a manner that the microstrip resonator 23 extends towards an anode of the Gunn diode 1. A mode suppressor 4 is accommodated in the input terminal of the NRD guide 8 in perpendicular to the microstrip resonator 23. The mode suppressor 4 is fixed by a fixing block 18. An oscillating signal of a high frequency generated from the Gunn diode 1 is outputted through the NRD guide 8 via the microstrip resonator 23.

However, the conventional local oscillator requires the diode mount 21 for installing the Gunn diode 1 and the bias choke 22. Accordingly, the diode mount 21 is provided with a cylindrical cavity 24 formed with a female screw portion therein so as to mount the Gunn diode 1. In addition, when the diode mount 21 is installed between the upper and lower conductive plates 11a and 11b, a fine gap is formed between the diode mount 21 and the upper and lower conductive plates 11a and 11b. The fine gap acts as a capacitance in a short wavelength of the millimeter wave band so that problems of an oscillation of harmonics and a poor grounding are resulted. In particular, in order to shield a leaky wave, it is required to form a plurality of slots 25 having a width of λ/4 and a predetermined depth on an upper surface of the diode mount 21, so the structure of the diode mount 21 becomes complicated. Accordingly, the diode mount 21 increases manufacturing costs. In addition, the upper and lower conductive plates 11a and 11b have to be formed with a recess for fixing the diode mount 21 so the structures of the upper and lower conductive plates 11a and 11b become complicated.

A heat emission is closely related to an oscillating efficiency of the local oscillator. The Gunn diode 1 generates a heat when it produces the oscillating signal, and the generated heat has to be effectively emitted so as to stably maintain an oscillating power and an oscillating frequency. Accordingly, the diode mount 21 is usually made of copper which is good in heat conductivity. The heat generated from the Gunn diode 1 is transferred to the upper and lower conductive plates 11a and 11b, which act as a heat sink, and is cooled by the upper and lower conductive plates 11a and 11b. However, the heat is indirectly transferred to the upper and lower conductive plates 11a and 11b via the diode mount 21, so the heat cannot be rapidly emitted. When the Gunn diode 1 is operated for a long time, a latent heat is fed back to the Gunn diode 1 so that a temperature of the Gunn diode 1 continuously increases. In this case, the Gunn diode 1 may generate an undesired oscillating power and an undesired oscillating frequency, thereby resulting a fatal fault to the system.

On the other hand, the Gunn diode 1 receives a direct current (DC) bias through the bias choke 22 mounted on the diode mount 21 and an oscillating signal produced by the Gunn diode 1 is transmitted to the NRD guide 8 through the microstrip resonator 23. The oscillating power and the oscillating frequency can be controlled by adjusting a width of a microstrip 23b and a length thereof. That is, the oscillating frequency becomes higher as the length of the microstrip 23b becomes shorter. On the contrary, the oscillating power becomes lower as the length of the microstrip 23b becomes shorter. The microstrip 23b is a thin conductive film which is formed on a dielectric substrate 23a by an etching process. Accordingly, the microstrip 23b increases manufacturing costs.

Furthermore, a center of the microstrip 23b has to be precisely arranged on the anode of the Gunn diode 1. In addition, a gap between the microstrip 23b and the anode of the Gunn diode 1 is one of the frequency tuning factors. Accordingly, it is required to precisely arrange the microstrip 23b and to finely maintain the gap in order to obtain a desired oscillating power and a desired oscillating frequency. However, it is very difficult to precisely arrange the microstrip 23b and the Gunn diode 1 in assembling them, so working efficiency is lowered.

On the other hand, as described above, the conventional local oscillator utilizes the length of the microstrip resonator 23 and the gap between the microstrip 23b and the anode of the Gunn diode 1 as tuning factors of the power and the frequency of the oscillating signal. However, the two tuning factors may be insufficient under certain circumstances.

SUMMARY OF THE INVENTION

The present invention has been made to solve the problems of the prior art, and accordingly, it is a first object of the present invention to provide a local oscillator in which a Gunn diode is directly mounted on a conductive plate in such a manner that a heat generated from the Gunn diode can be rapidly emitted, thereby stably carrying out an oscillating operation, and which allow low manufacturing costs and improve productivity by removing a diode mount.

A second object of the present invention is to provide a local oscillator capable of improving an oscillating characteristic in which a metal rod resonator, which is easily manufactured and has a superiority in power and frequency stability as compared with a microstrip resonator, and a cavity forming member for device protections and frequency tuning are installed.

According to the present invention, there is provided a local oscillator having a Gunn diode for generating an oscillating signal of millimeter wavelength by using a bias voltage, a resonating member for transferring the oscillating signal by adjusting a power of the oscillating signal and a frequency thereof, an NRD guide for guiding the oscillating signal inputted into an input terminal thereof to an output terminal thereof, and an LSE mode suppressor inserted into the input terminal of the NRD guide, for preventing an LSE mode of the oscillating signal transferred from the resonating member from passing therethrough while allowing an LSM mode of the oscillating signal to pass therethrough. The local oscillator also has a housing including an upper conductive plate and a lower conductive plate, for accommodating the Gunn diode, the resonating member, the NRD guide, the LSE mode suppressor therewithin. In the local oscillator, the Gunn diode is vertically buried in a first coupling hole formed at a bottom of the lower conductive plate such that an anode thereof is exposed to an exterior so as to directly transfer a heat generated from the Gunn diode to the lower conductive plate.

It is preferable that the structures and arrangements of the respective components of the local oscillator are matched with the arrangement of the Gunn diode. In detail, the Gunn diode is screw-coupled into the first coupling hole. The resonating member includes a fixing block which is installed to be in contact with the input terminal of the NRD guide and is formed with a second coupling hole, and a metal rod resonator which is inserted into the fixing block such that an end thereof is exposed to the exterior. The metal rod resonator is arranged in perpendicular to a length direction of the NRD guide and the exposed end thereof directly makes contact with the anode of the Gunn diode. The fixing block is press-fitted into a mounting groove formed at the lower conductive plate. A direct coupling between an end of the metal rod resonator and the anode of the Gunn diode can be obtained by soldering. A groove for reducing a leaky wave is formed around a contour of the housing.

The local oscillator of the present invention further comprises a bias choke which rejects a harmonic component of a bias power supplied from a bias feeding through so as to transfer a DC bias into the Gunn diode. The bias choke is fabricated by etching a thin copper film, which is laminated on a dielectric substrate, in a form of a microstrip and is arranged in parallel on the lower conductive plate. The bias feeding through and the Gunn diode are connected to each other by a wire.

The local oscillator of the present invention further includes a cavity forming member which is installed in the housing for stabilizing the power of the oscillating signal and the frequency thereof. The cavity forming member is formed with an opening through which the NRD guide passes and defines a cavity which surrounds the input terminal of the NRD guide, the Gunn diode, the resonating member and the mode suppressor. The cavity forming member is formed at a bottom thereof with a bias choke passing groove. The bias choke is positioned in a space defined by the lower conductive plate and the groove. A $\lambda/4$ groove is formed on a bottom of the cavity forming member along a length direction thereof in order to reduce the leaky wave of the housing. The cavity forming member is coupled to the lower conductive plate by screws used for tuning the frequency.

The local oscillator having the above structure does not require a diode mount, so not only is the oscillation of harmonics caused by a gap between the housing and the Gunn diode prevented, but also the manufacturing costs and time are saved. In addition, since the heat generated from the Gunn diode is directly transferred to the housing and is rapidly emitted, the Gunn diode can be stably operated so that the stability for the power of the oscillating signal and the frequency thereof can be improved. Accordingly, a desired carrier signal of millimeter wavelength is stably supplied to a local oscillating module and a telecommunication system adopting the same. The Gunn diode is vertically coupled to a conductive bottom surface of the housing, so the frequency tuning can be carried out under the bottom surface of the housing, if necessary.

BRIEF DESCRIPTION OF THE DRAWINGS

The above objects and other advantages of the present invention will become more apparent by describing in detail a preferred embodiment thereof with reference to the attached drawings, in which.

DETAILED DESCRIPTION OF THE PREFERRED EMBODIMENT

Hereinafter, preferred embodiments of the present invention will be described in detail with reference to the accompanying drawings.

Figure 4:
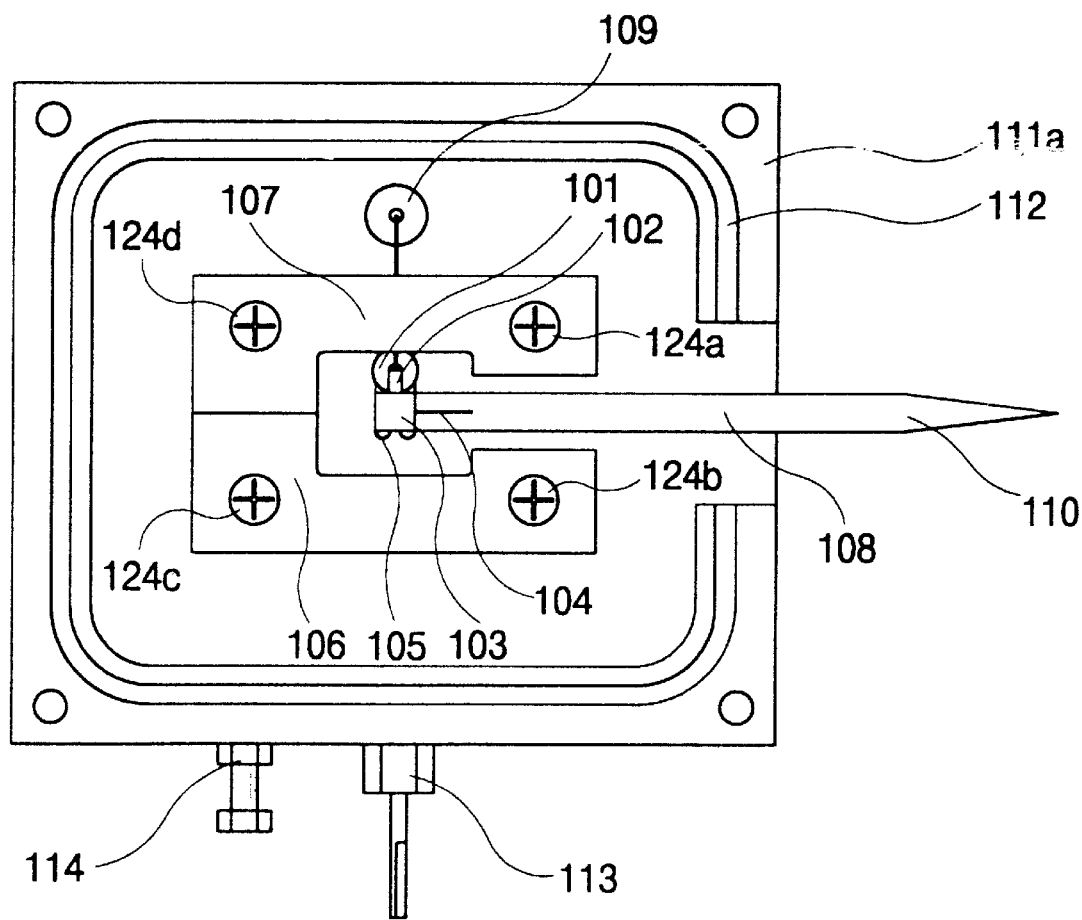
FIG. 4 is a plan view showing the structure of the millimeter wave local oscillator according to one embodiment of the present invention.
Figure 5:
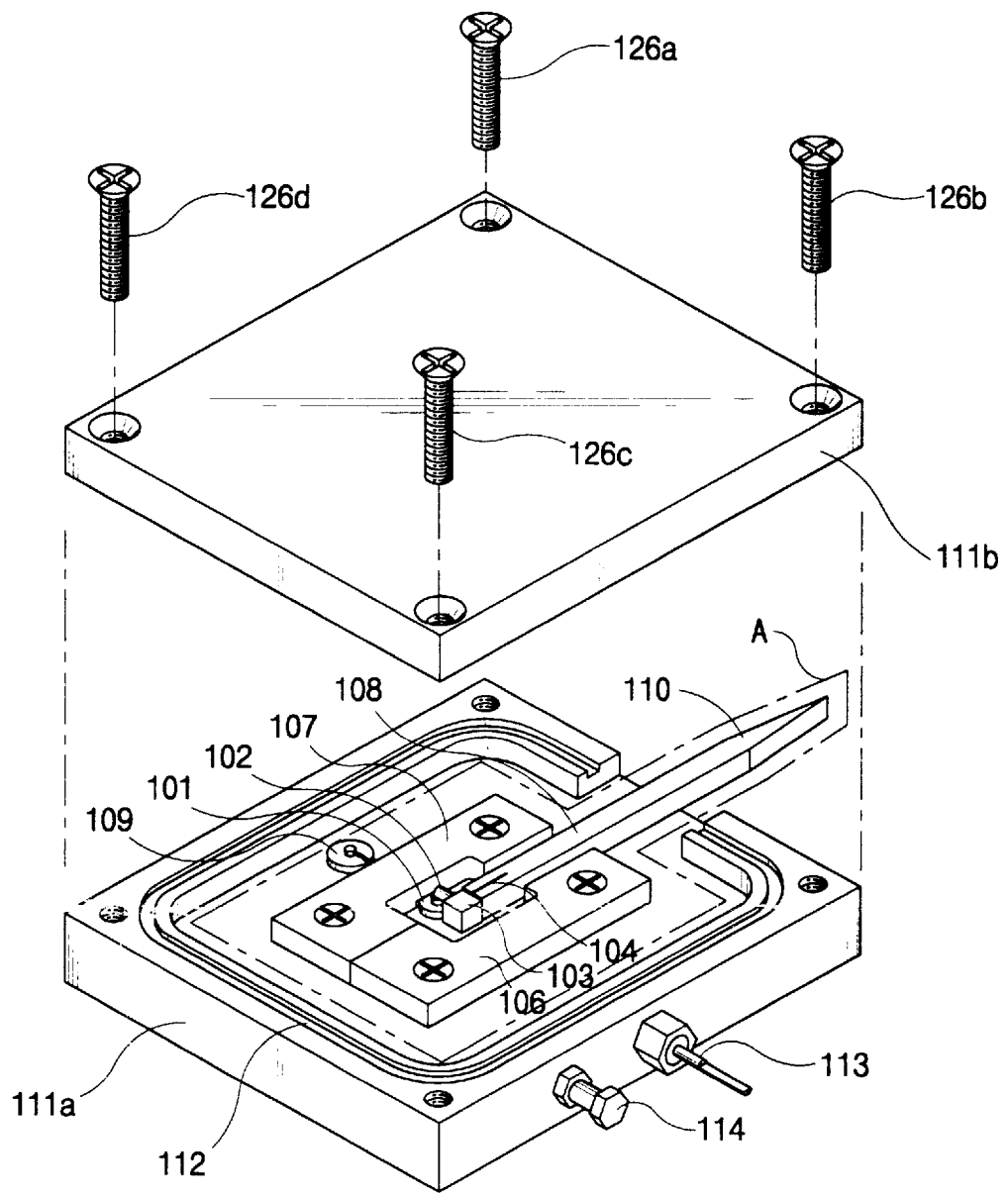
FIG. 5 is an exploded view showing the structure of the millimeter wave local oscillator according to one embodiment of the present invention.
Figure 6:
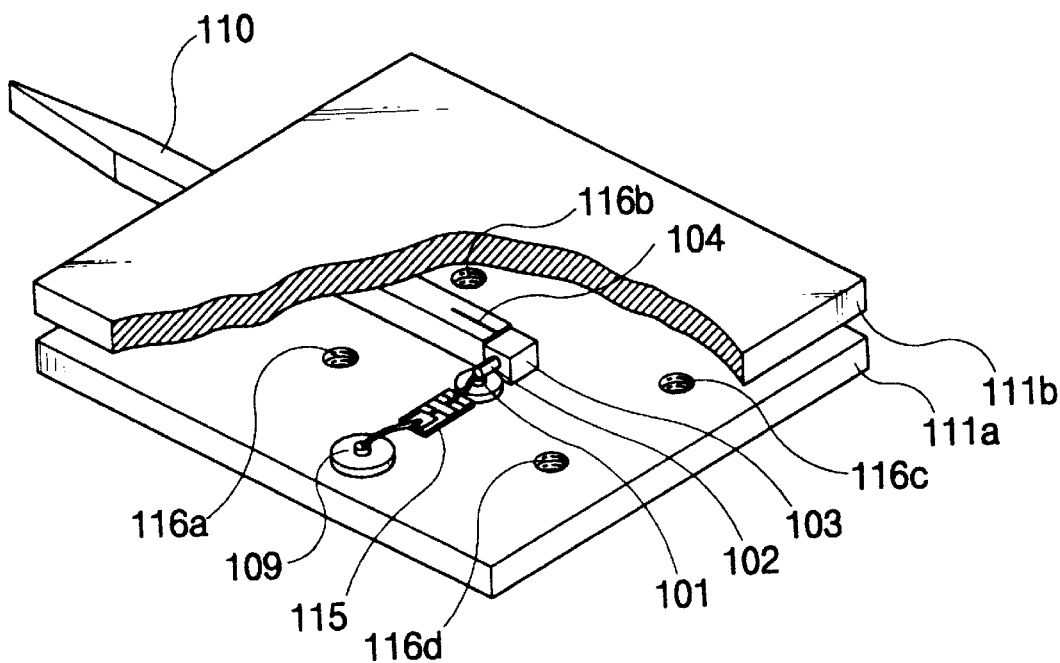
FIG. 6 is a partially sectioned perspective view of "A" in FIG. 5 in which cavity forming members are removed.
Figure 7:
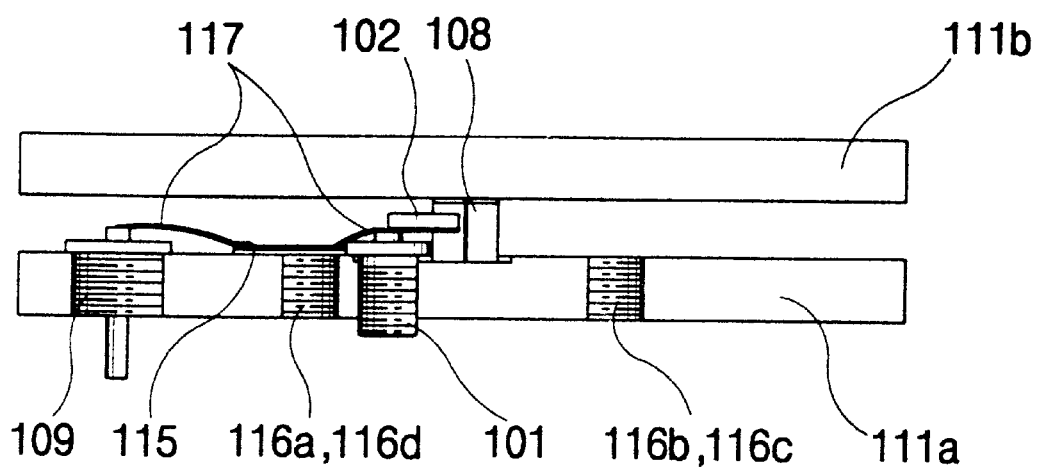
FIGS. 7 and 8 are left side and front views of the millimeter wave local oscillator, respectively, shown in FIG. 6.
Figure 8:
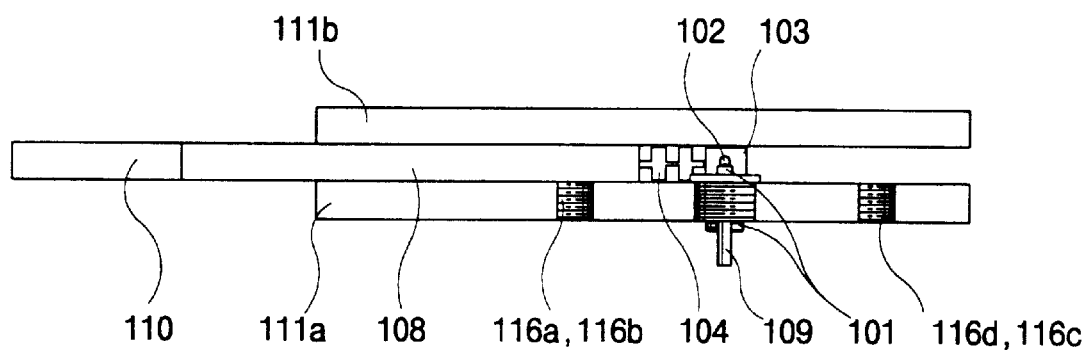

FIGS. 4 to 8 show the structure of a millimeter wave local oscillator according to the present invention. FIGS. 4 and 5 respectively illustrate a plan view and an exploded view of the structure of the millimeter wave local oscillator according to one embodiment of the present invention. FIG. 6 is a partially sectioned perspective view of the millimeter wave local oscillator shown in FIG. 5 in which cavity forming members are removed. FIGS. 7 and 8 respectively illustrate a left side view and a front view of the millimeter wave local oscillator shown in FIG. 6.

The local oscillator of the present invention includes a Gunn diode 101 which receives a DC bias voltage and generates a millimeter wave oscillating signal, a bias choke 115 for supplying a bias signal to the Gunn diode 101, a metal rod resonator 102 for adjusting a power and a frequency of the oscillating signal of the Gunn diode 101, a fixing block 103 which supports the metal rod resonator 102 for tuning the power of the oscillating signal and the frequency thereof, a mode suppressor 104 for shielding an LFS mode, an NRD guide 108, and cavity forming members 106 and 107.

The above components are installed in a housing having an upper conductive plate 111b and a lower conductive plate 111a which is opposed in parallel to the upper conductive plate 111b. The upper and lower conductive plates 111b and 111a are formed at edges thereof with coupling holes. Coupling screws 126a', 126b' 126c' and 126d' are screw-coupled into the coupling holes, thereby assembling the upper conductive plate 111b to the lower conductive plate 111a. In addition, a groove 112 is formed along a contour of the upper and lower conductive plates 111b and 111a for shielding a leaky wave. A bias power supplying terminal 113 and a grounding pin 114 are arranged at a side of the lower conductive plate 111a, respectively. A bias power is supplied to the bias power supplying terminal 113 from an exterior. When the NRD guide 108 is installed in the housing, an output terminal 110 of the NRD guide 108, which acts as a rod antenna, is protruded to the exterior. The mode suppressor 104 is accommodated in an input terminal of the NRD guide 108 in a length direction of the NRD guide 108 by using a mode suppressor fixing block 118 (referred to FIGS. 9 and 10).

Figure 1:
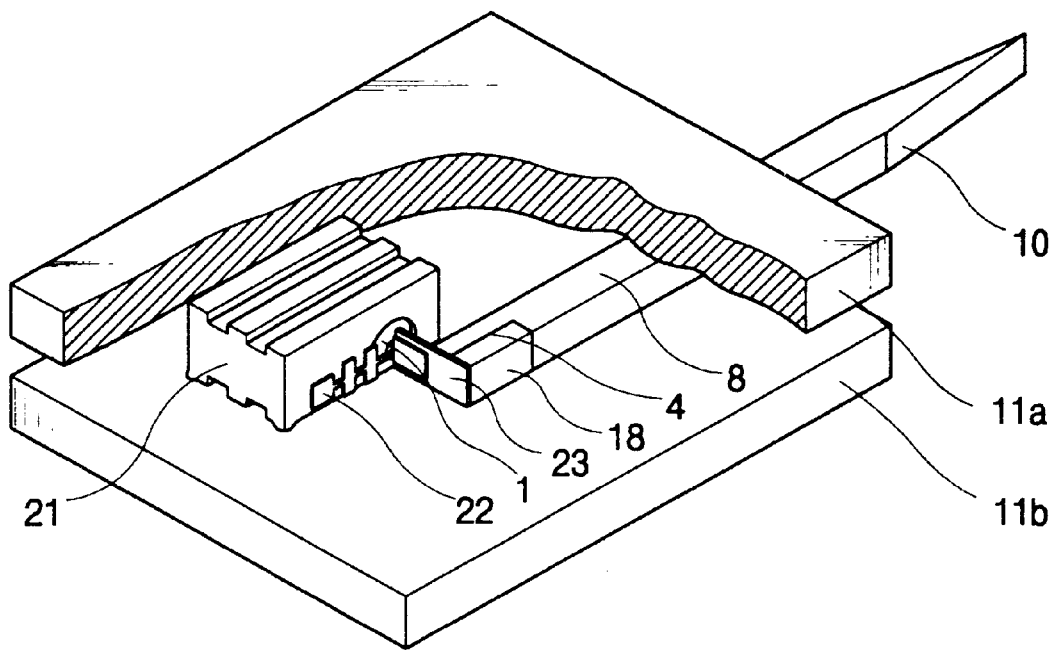
FIG. 1 is a perspective view showing the structure of a conventional local oscillator.
Figure 2A:
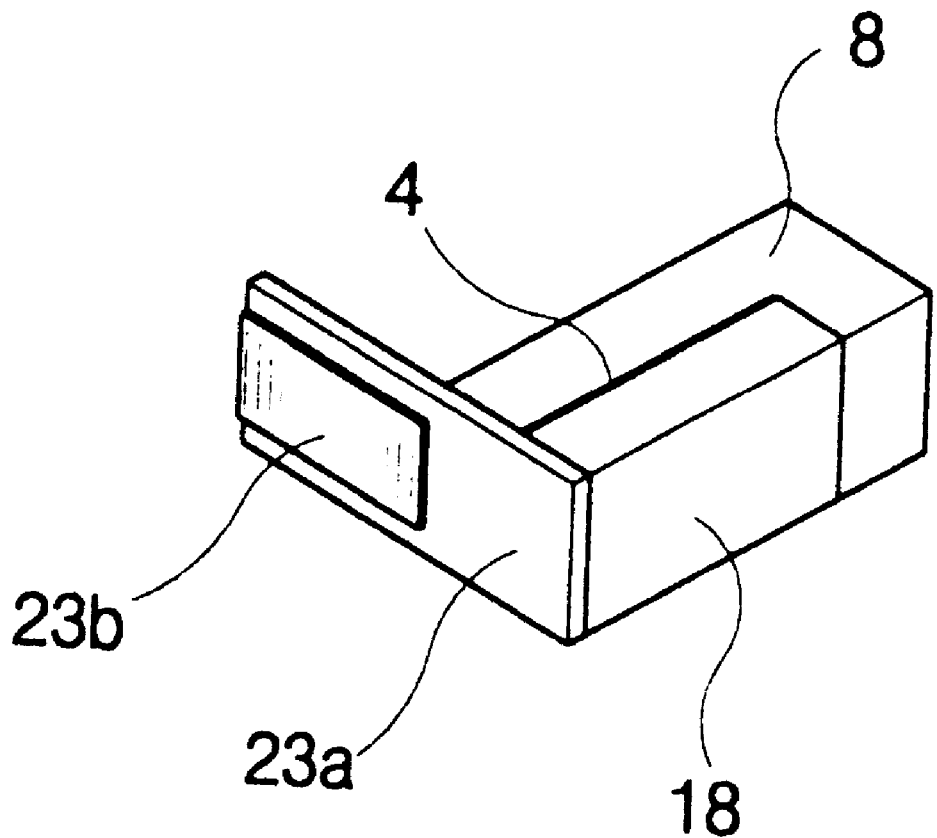
FIGS. 2a and 2b are perspective views showing the coupling method of an NRD guide of a microstrip resonator in the conventional local oscillator.
Figure 2B:
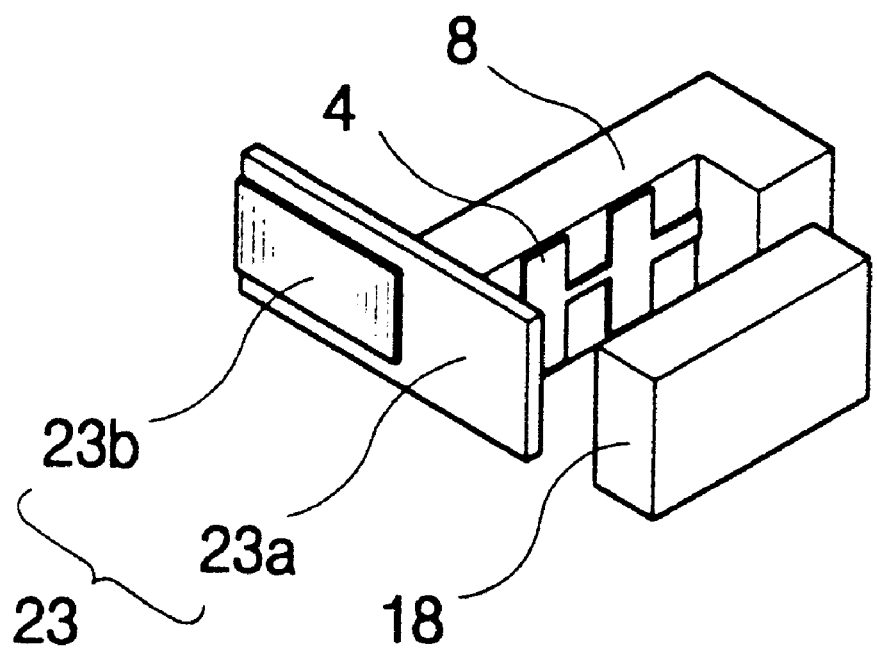
Figure 3:
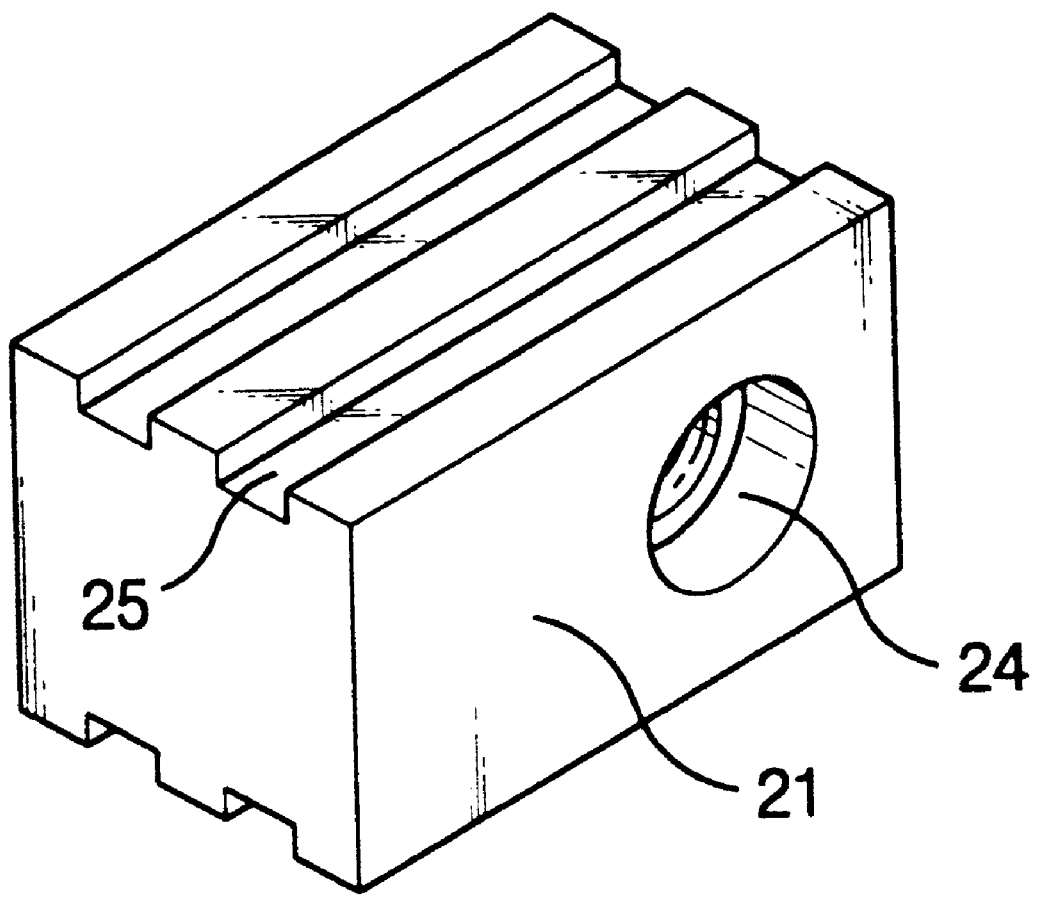
FIG. 3 is a perspective view showing the structure of a diode mount for mounting a Gunn diode in the conventional local oscillator.
Figure 15:
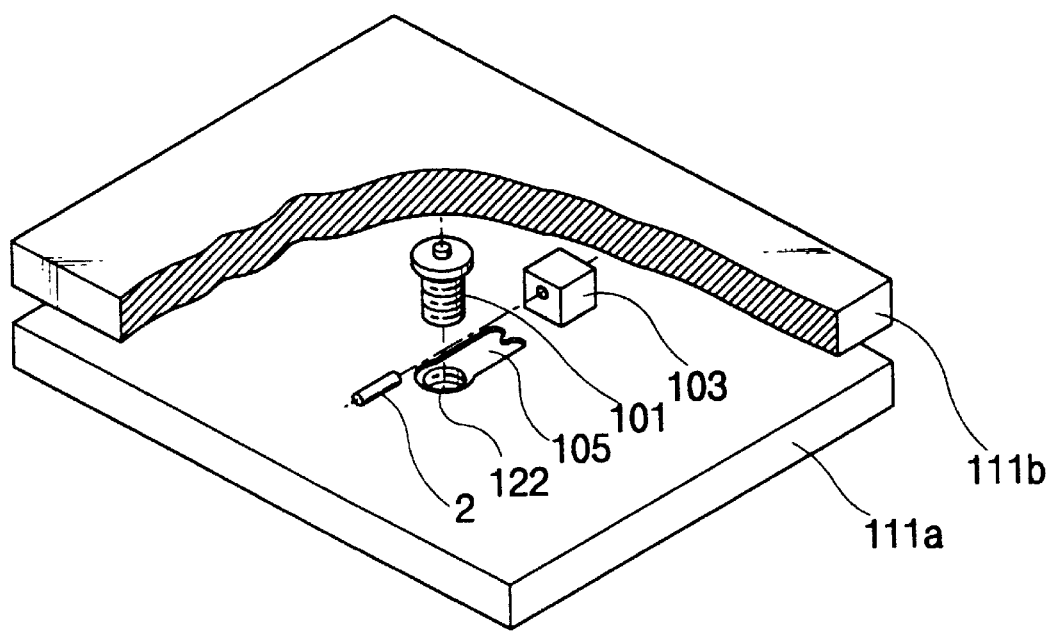
FIG. 15 is a partially sectioned perspective view showing a mounting groove for press-fitting the fixing block therein.
Figure 16:
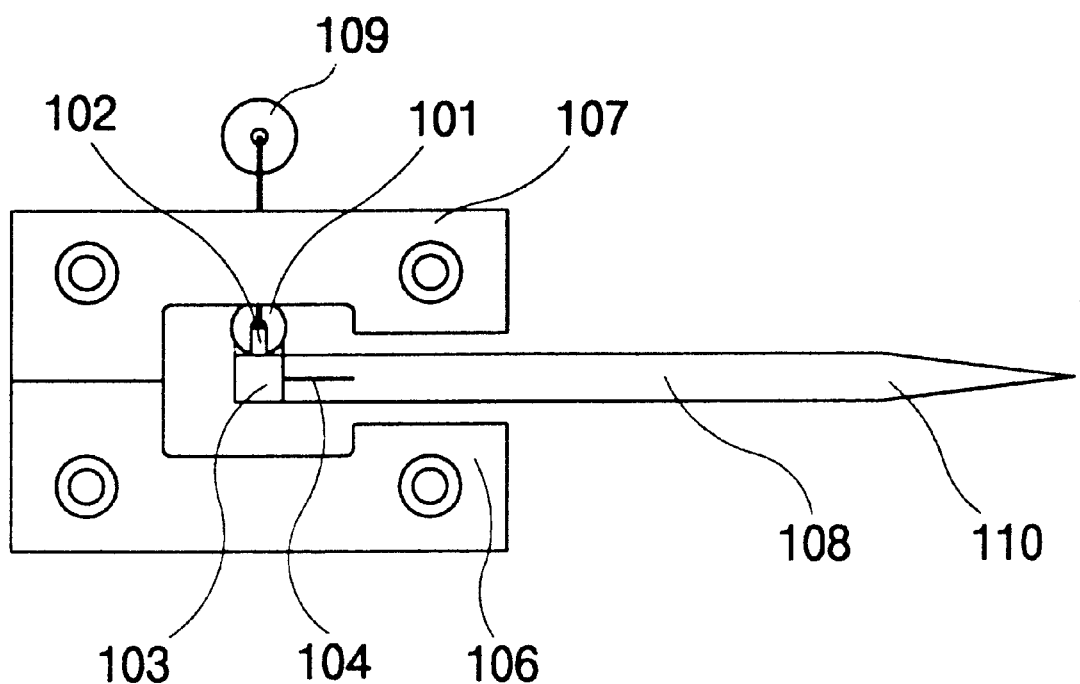
FIG. 16 a plan view of the cavity forming members.
Figure 17:
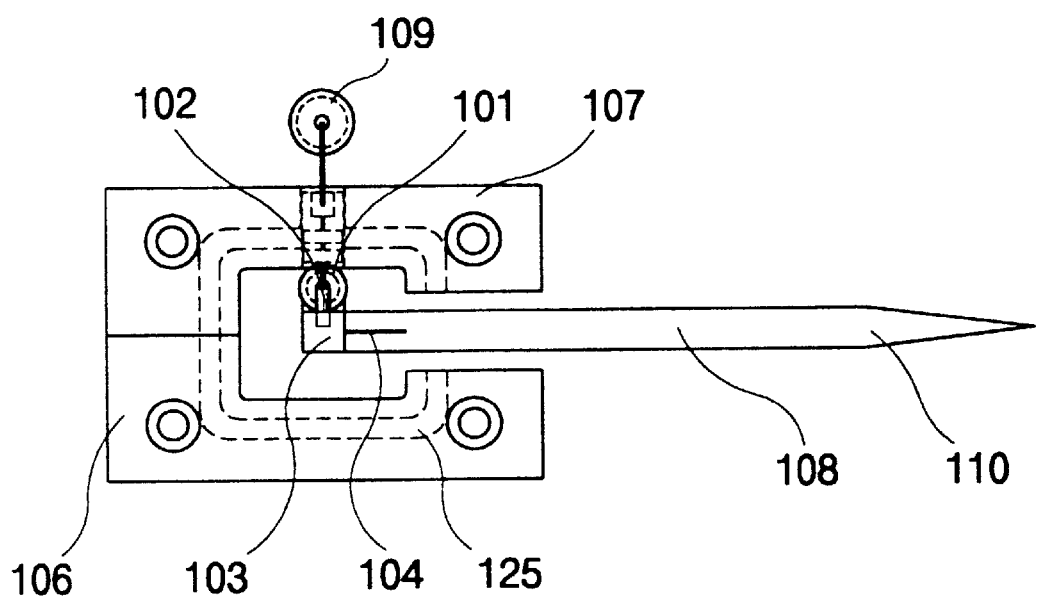
FIG. 17 is a plan view similar to FIG. 16, in which the inner structure of the cavity forming members is illustrated with dot lines.
Figure 18:
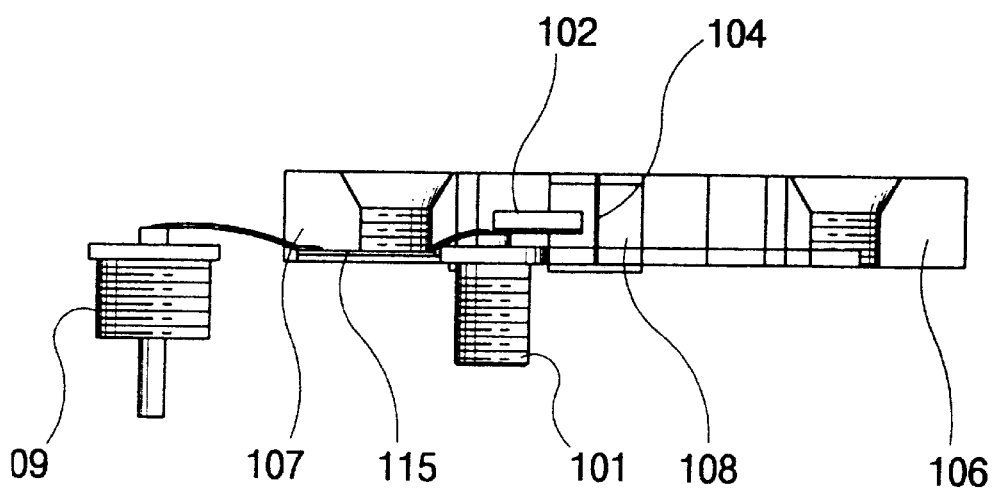
FIG. 18 is a left side view of FIG. 16.
Figure 19:
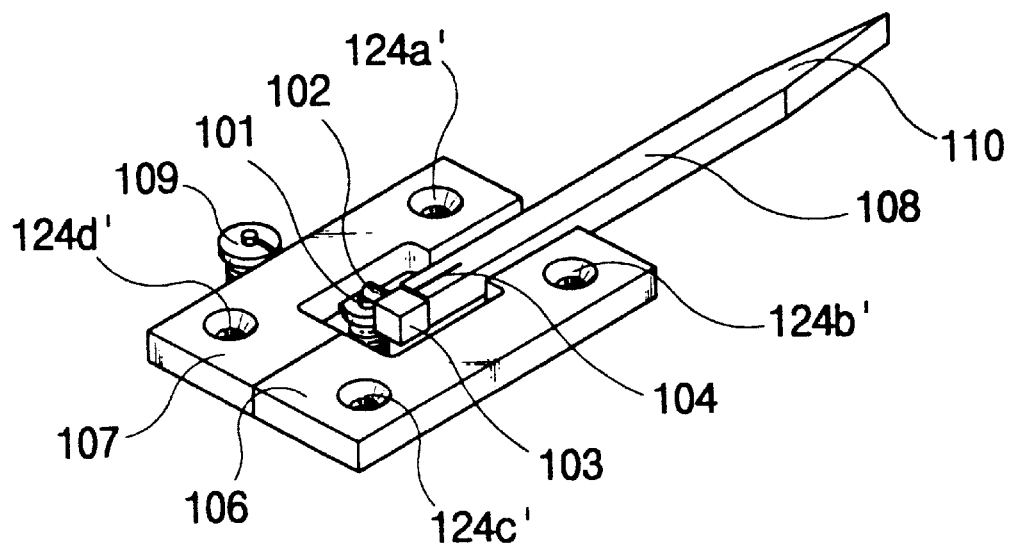
FIG. 19 is a perspective view of FIG. 16.

The Gunn diode 101 is vertically buried in a bottom of the lower conductive plate 111a, which acts as a heat sink, so that a heat generated from the Gunn diode 101 is directly transferred to the lower conductive plate 111a. Accordingly, a coupling hole 122 is formed on the bottom of the lower conductive plate 111a (referred to FIG. 15) and the Gunn diode 101 is vertically inserted into the coupling hole 122. It is preferable that the Gunn diode 101 is screw-coupled into the coupling hole 122 for a tight coupling. Since the Gunn diode 101 is screw-coupled into the coupling hole 122 formed in the lower conductive plate 111a, a separate diode mount 21 shown in FIG. 1 for installing the Gunn diode is not required. In addition, since the Gunn diode 101 has a direct contact with the lower conductive plate 111a, the housing rapidly absorbs and emits the heat generated from the Gunn diode 101. Accordingly, a feedback of the heat to the Gunn diode 101 can be prevented, so the Gunn diode 101 is stably operated with little variation in its output, thereby generating a stable oscillating signal of millimeter wavelength. Furthermore, the local oscillator of the present invention does not require to form a pocket in the housing for mounting the diode mount 21 as shown in FIG. 1, so the local oscillator is adapted for mass production.

Figure 11A:
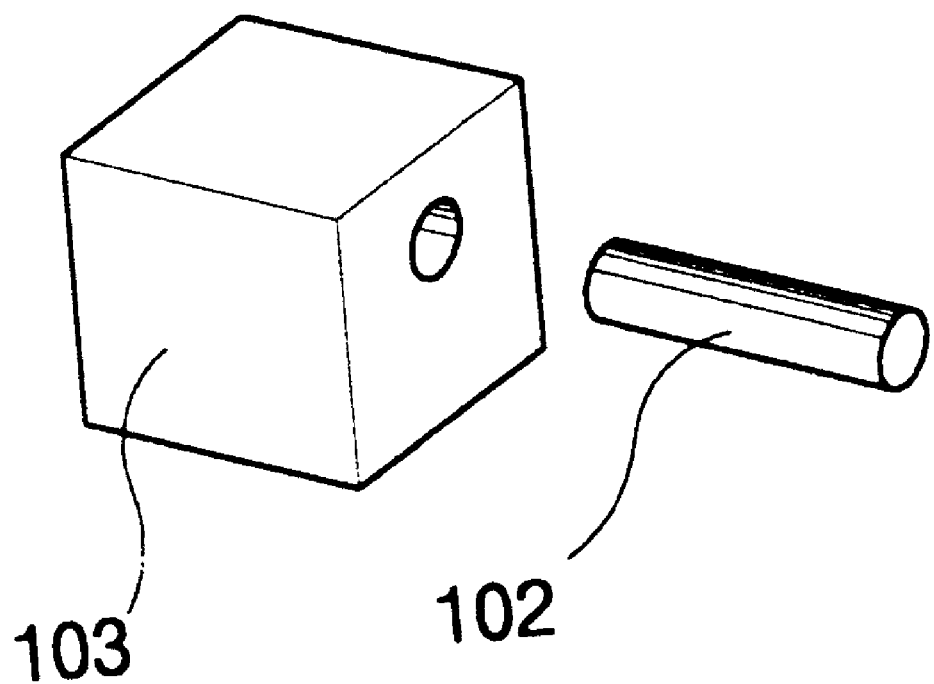
FIGS. 11a and 11b are perspective views showing the metal rod resonator coupled to a fixing block.
Figure 11B:
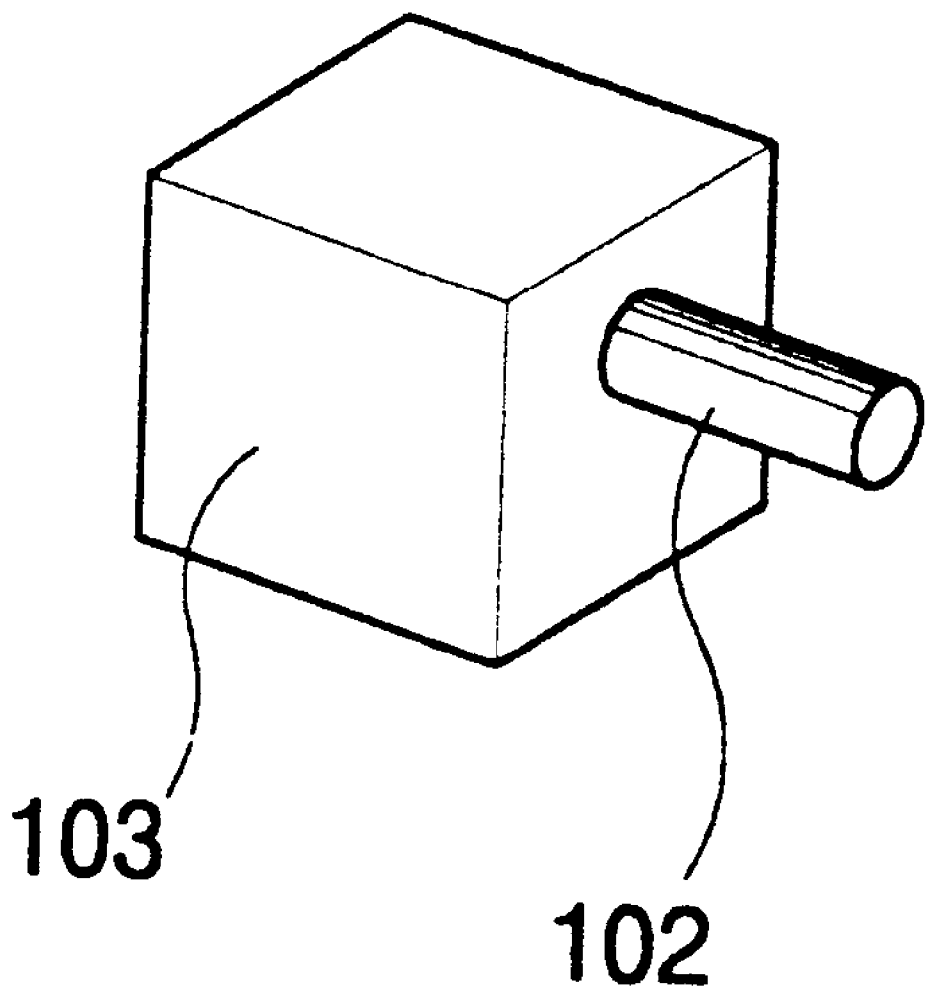
Figure 13:
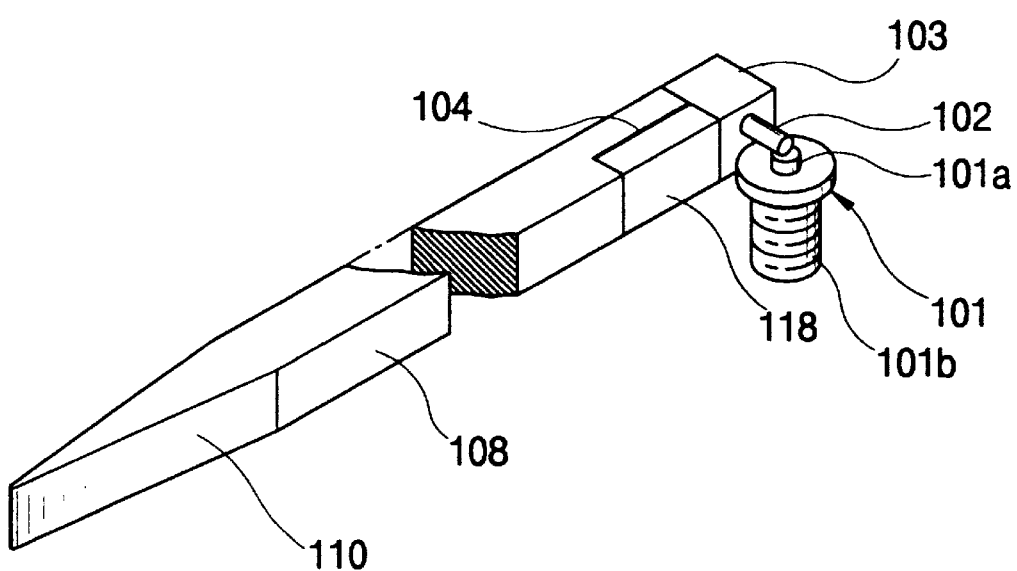
FIG. 13 is a perspective view showing the arrangement of the Gunn diode, the rod resonator, the mode suppressor and the NRD guide.
Figure 14:
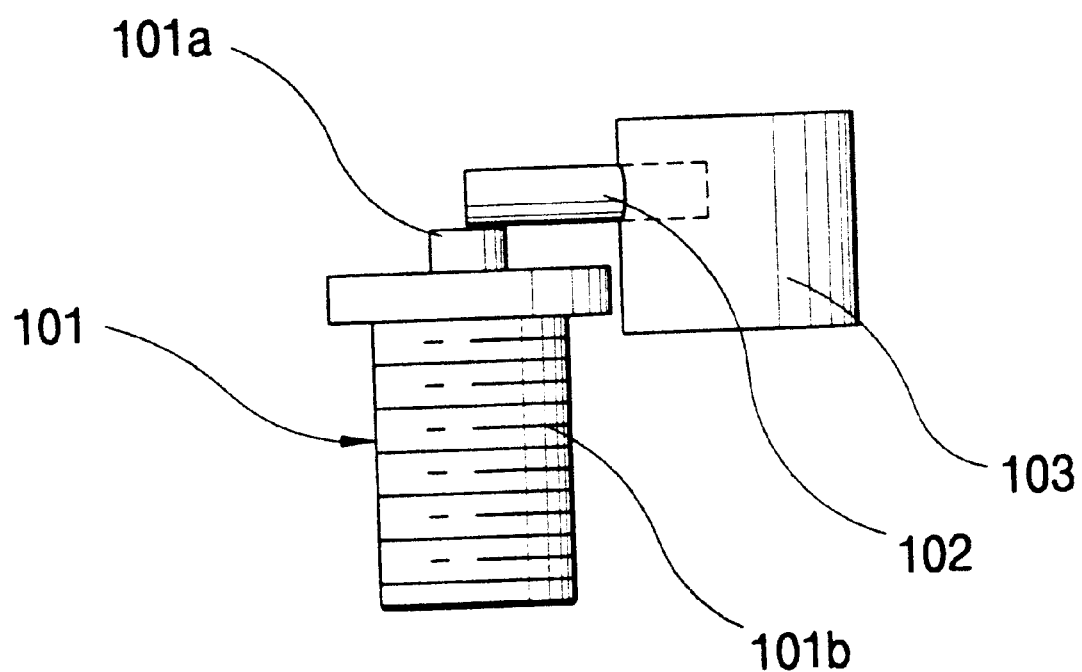
FIG. 14 is a right side view of FIG. 13.

The metal rod resonator 102 is a metal bar having a predetermined length. The metal rod resonator 102 is inserted into the fixing block 103 by forming a slot having a size corresponding to a diameter of the metal rod resonator 102 in the fixing block 103. At this time, one end of the metal rod resonator 102 is exposed to the exterior (referred to FIG. 11). The fixing block 103 is accommodated in a mounting groove 105, which is formed near to the coupling hole 122 of the lower conductive plate 111a, so that the fixing block 103 is arranged near to the input terminal of the NRD guide 108 (referred to FIGS. 9, 13 and 15). As a result, the metal rod resonator 102 is arranged in perpendicular to the length direction of the NRD guide 108 for forming an LSM mode and the exposed end of the metal rod resonator 102 is connected to an anode of the Gunn diode 101. Preferably, the metal rod resonator 102 directly makes contact with the Gunn diode 101. For providing a stable direct contact soldering the metal rod resonator 102 with the Gunn diode 101 is a recommendable coupling method (referred to FIGS. 13 and 14).

A millimeter wave has a very short wavelength, so the power of the oscillating signal and the frequency thereof are sensitive to the dimensions of components. These features make it difficult to stablize the power of the oscillating signal and the frequency thereof but may be the grounds that the power of the oscillating signal and the frequency thereof can be tuned. The power of the oscillating signal and the frequency thereof, which are generated from the Gunn diode 101, are changed depending on a length of the metal rod resonator 102. For example, if the length of the metal rod resonator 102 is short, a high oscillating frequency and a low oscillating power are obtained. This feature can be applied for the tuning of the power of the oscillating signal and the frequency thereof.

In addition, the tuning of the power of the oscillating signal and the frequency thereof can be carried out by adjusting the length of the fixing block 103 which supports the metal rod resonator 102. The metal rod resonator 102 and the fixing block 103 of the present invention are easily fabricated with a simple construction, so the desired oscillating signal can be obtained by simply changing their designs. In addition, the mounting groove 105 allows the local oscillator to be precisely assembled and improves the precision of the tuning work since the tuning of the power and the frequency is carried out along the mounting groove 105.

Figure 12:
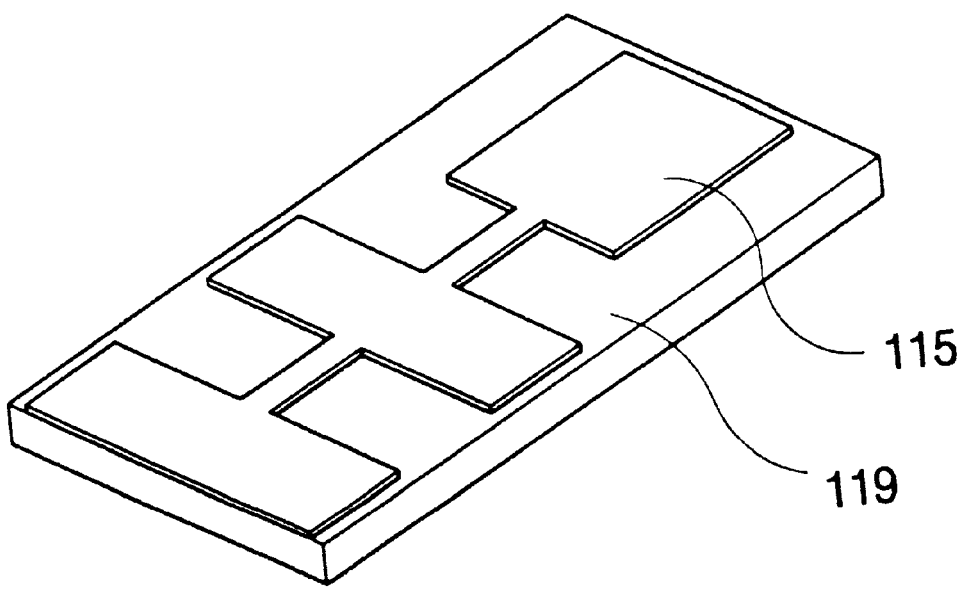
FIG. 12 is a perspective view showing the structure of a bias choke.

FIG. 12 shows the bias choke 115 which receives a bias current from a bias feeding through 109 so as to supply a DC bias to the Gunn diode 101 by rejecting a harmonic component contained in the bias current. The bias choke 115 is designed as a radio frequency choke to stably supply the DC bias and to prevent the feedback of the oscillating signal. The bias choke 115 is fabricated in the form of a microstrip by etching a thin copper film stacked on a bias choke substrate 119 made from a dielectric material. When assembled, the bias choke 115 is parallel arranged on the lower conductive plate 111a between the bias feeding through 109 and the Gunn diode 101. The bias choke 115 is connected to both the bias feeding through 109 and the Gunn diode 101 by a bias feeding wire 117 (referred to FIGS. 6 and 7). The bias feeding through 109 is electrically connected to a bias power feeding terminal 113 which receives the bias power from the exterior.

Figure 9:
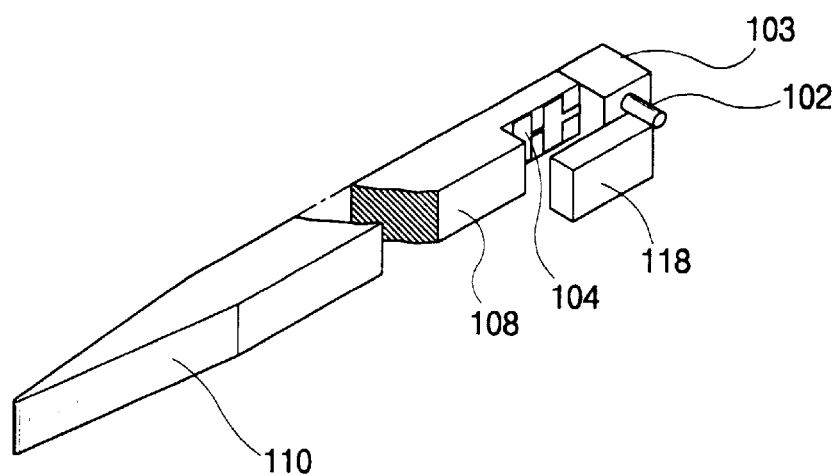
FIG. 9 is a perspective view showing a metal rod resonator and a mode suppressor coupled thereto.
Figure 10A:
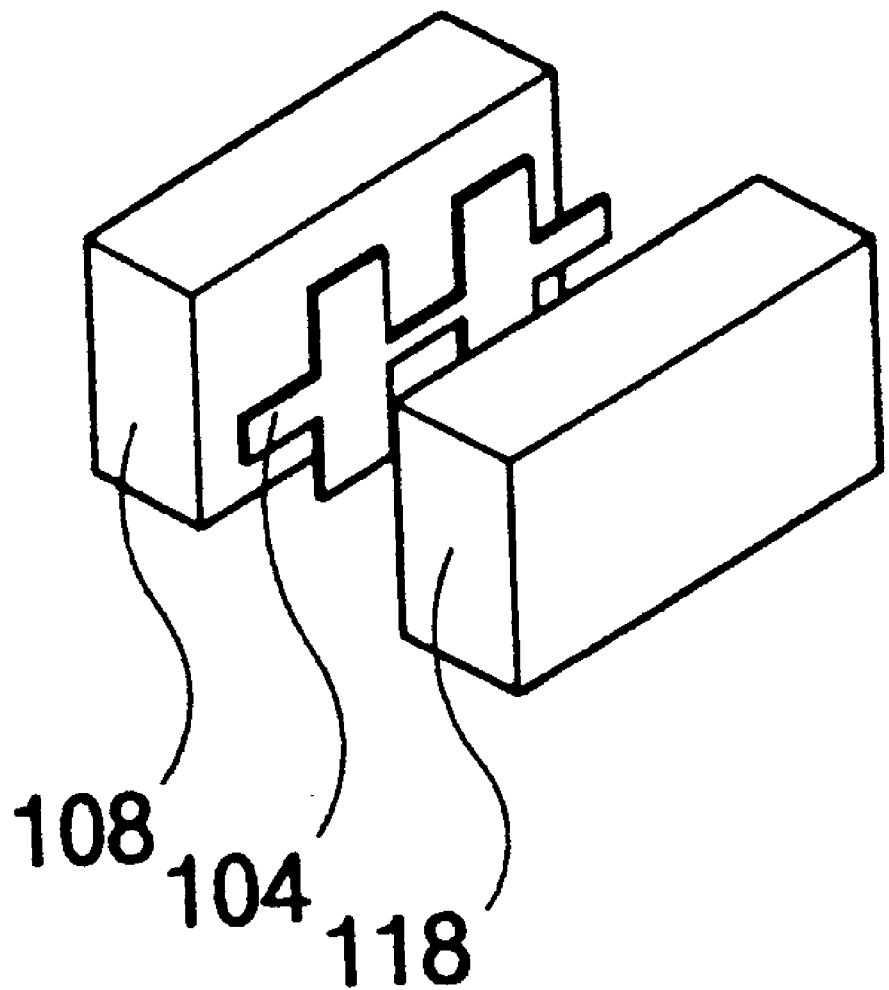
FIGS. 10a and 10b are perspective views showing the structure of the mode suppressor.
Figure 10B:
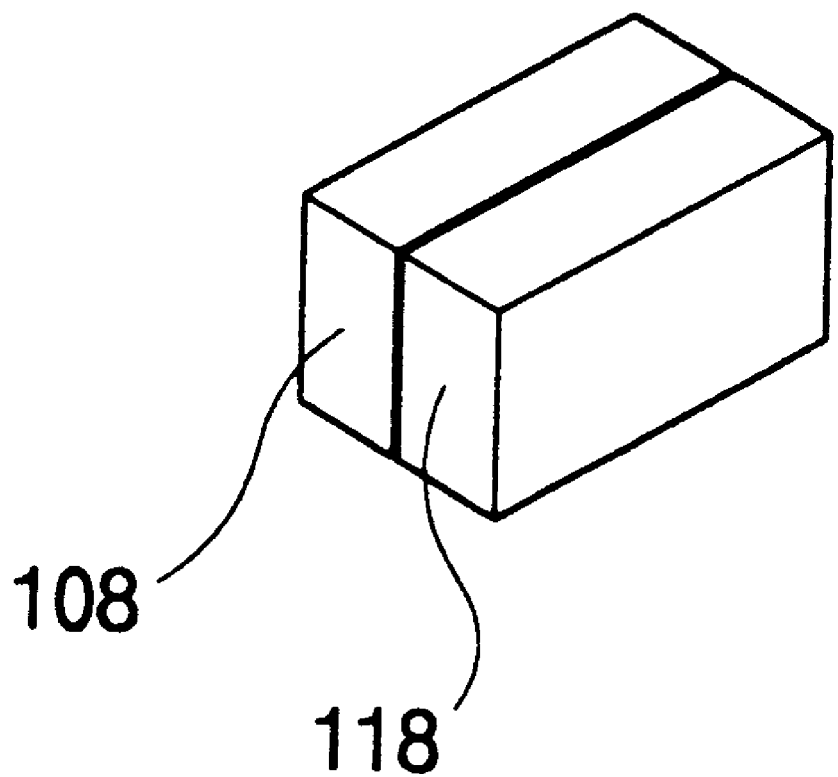

The structure and the arrangement of the mode suppressor 104 are illustrated in FIGS. 9 and 10. The mode suppressor 104 suppresses the LSE mode which is generated when the oscillating power is applied to the NRD guide 108 through the metal rod resonator 102. The mode suppressor 104 is in the form of a low pass filter pattern having a step impedance structure. The mode suppressor 104 is inserted into a central magnetic field (H-field) of the NRD guide 108 so as to allow the LSM mode to pass therethrough and so as to prevent an LSE mode from passing therethrough, thereby reducing a loss caused by the LSE mode. The direction of an electric field of the LSM mode is in parallel to the upper and lower conductive plates at a center of the NRD guide 108, so the LSM mode is not influenced by inserting the conductive plate into the central magnetic field surface. At this time, the electric field component of the LSE mode is extinguished by a boundary condition with respect to the conductive plate. A mode suppressor fixing block 118 is provided to support the inserted conductive plate and to form a transmission line.

Figure 20:
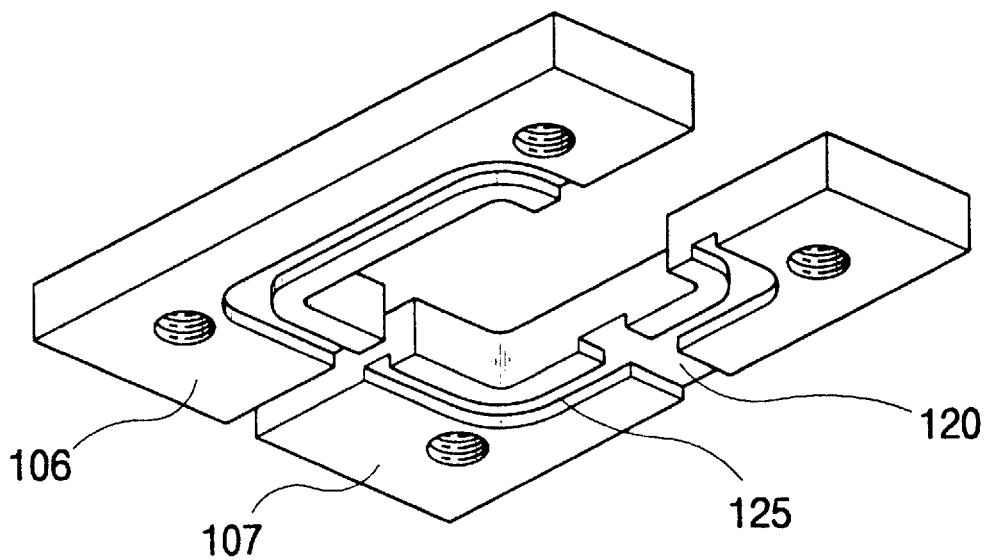
FIG. 20 is a perspective view showing a bottom surface of the cavity forming members.

In addition, the local oscillator further includes cavity forming members 106 and 107 for stabilizing the power and the frequency of the oscillating signal. The cavity forming members 106 and 107 are metal plates having λ-shapes. The cavity forming members 106 and 107 are formed with coupling holes 124a', 124b', 124c' and 124d' which are corresponding to coupling holes 116a', 116b', 116c' and 116d' formed in the lower conductive plate 111a. Screws 124a, 124b, 124c and 124d used for tuning the frequency are screw-coupled into the coupling holes so as to assemble the cavity forming members 106 and 107 to the lower conductive plate 111a. The cavity forming members 106 and 107 are installed between the upper and lower conductive plates 111b and 111a and are fixed to the lower conductive plate 111a. The cavity forming members 106 and 107 define a cavity which surrounds the input terminal of the NRD guide 108 in which the Gunn diode 101, the metal rod resonator 102, the fixing block 103, and the mode suppressor 104 are accommodated. The cavity is formed with an opening through which the NRD guide 108 is installed (referred to FIGS. 4 and 5). In order to introduce the bias choke substrate 119 for feeding a bias into the cavity forming members, a bias choke passing groove 120 is formed at a bottom surface of the cavity forming member 107. In addition, a λ/4 groove 120 is formed on bottom surfaces of the cavity forming members 106 and 107 so as to shield the leaky wave flowing through a gap between the housing and the cavity forming members 106 and 107 (referred to FIG. 20). By forming a cavity which surrounds main components of the local oscillator around the Gunn diode 101, a local oscillator module can be protected from an external impact and the output power and frequency of the millimeter wave oscillating signal can be stably generated. The oscillating signal of the Gunn diode 101 becomes stable in a frequency band satisfying a cavity condition.

Hereinafter, creation and transmission of the oscillating signal in the local oscillator having the above structure will be described.

The bias current is supplied through the bias power feeding terminal 113 and the bias feeding through 109. The harmonic component contained in the bias current is rejected while the bias current is passing through the bias choke 115, so the DC component of the bias current is supplied to the Gunn diode 101. Upon receiving the DC bias current, the Gunn diode 101 generates the oscillating signal of millimeter wavelength satisfying the cavity condition. The signal passes through the metal rod resonator 102 which is arranged in perpendicular to the Gunn diode 101 so that the power and the frequency the signal are adjusted to a desired level. Then, the signal is applied in the LSM mode to the NRD guide 108 and is transmitted along the NRD guide 108. At this time, the LSE mode is also created. The mode suppressor 104 functions for the suppressing of the LSE mode. The mode suppressor 104 is positioned at the center of the H-field of the NRD guide 108, the mode suppressor 104 can effectively suppress the LSE mode without causing any loss of the LSM mode. That is, the mode suppressor 104 allows the LSM mode of the oscillating signal transferred from the metal rod resonator 102 to pass therethrough but it prevents the LSE mode from passing therethrough. As a result, only the LSM mode of the oscillating signal is transferred to the output terminal 110 of the NRD guide without a radiation loss, so that an electromagnetic wave of millimeter wavelength can be radiated from the output terminal 110 of the NRD guide 108.

Figure 21:
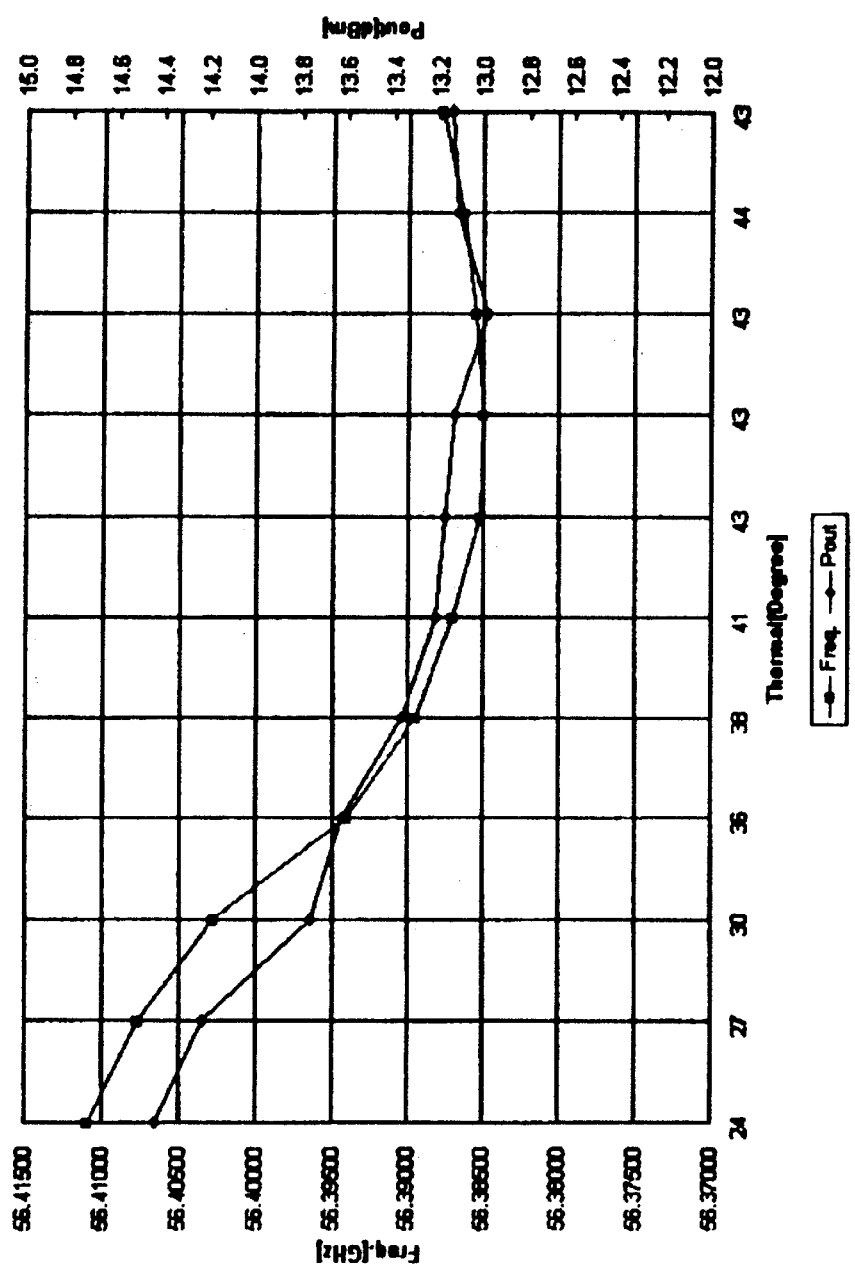
FIG. 21 is a graph showing an oscillating frequency and an oscillating power as a function of a temperature of a device under test (DUT)

FIG. 21 is a graph showing the oscillating frequency and the oscillating power as a function of a temperature in the local oscillator of the present invention, wherein the oscillating frequency and the oscillating power are measured at an interval of one hour after applying the bias to the local oscillator. A temperature of the DUT is 24° C. when the bias is applied to the local oscillator. After 10 hours has lapsed, the temperature of the DUT increases up to 43° C. and is stably maintained at that point. The oscillating power and the oscillating frequency are also stably maintained. The measured data illustrate the effectiveness of a mounting structure of the local oscillator.

Figure 22A:
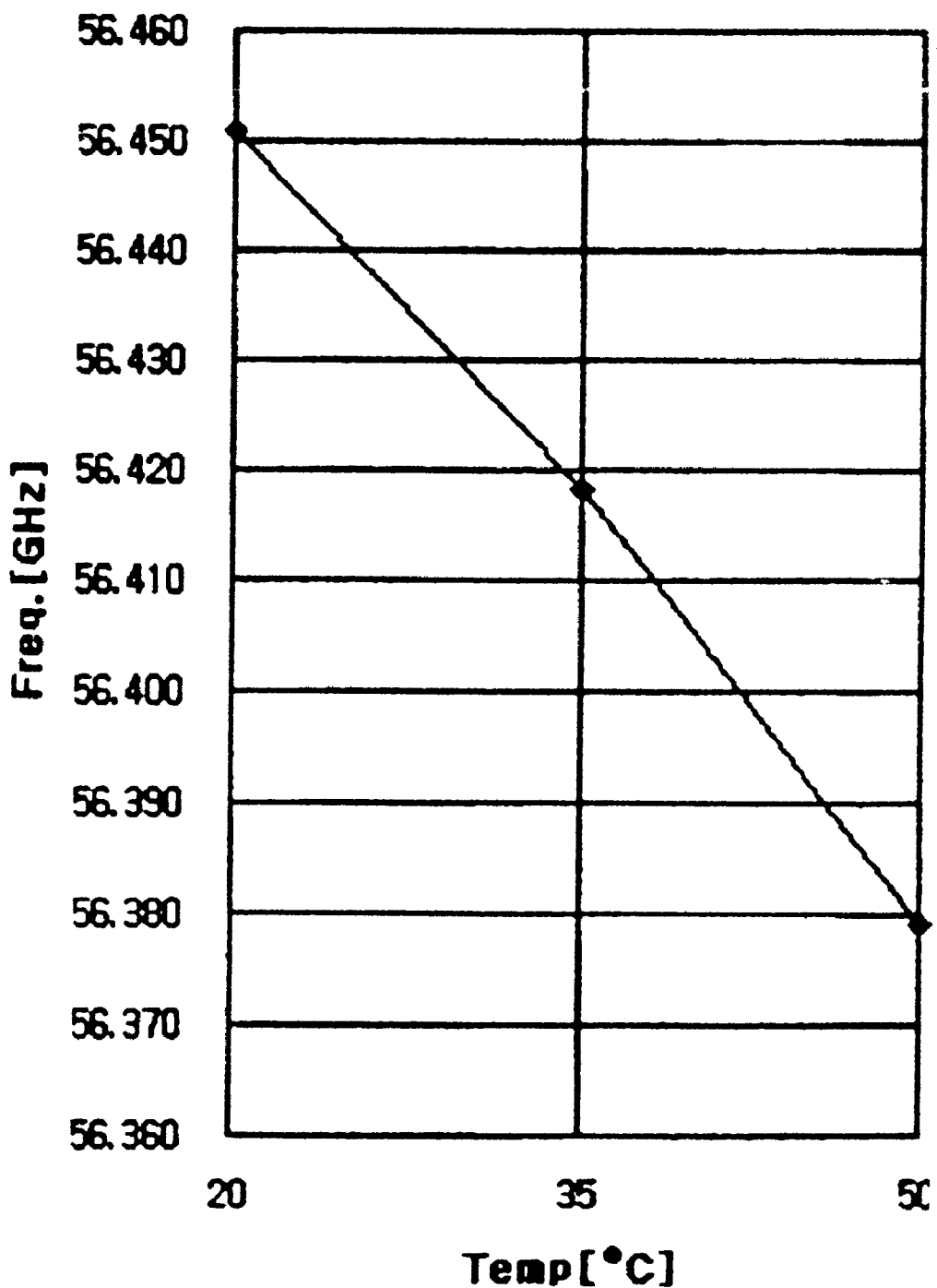
FIGS. 22a and 22b are graphs showing the oscillating frequency obtained through a heat impact test.
Figure 22B:
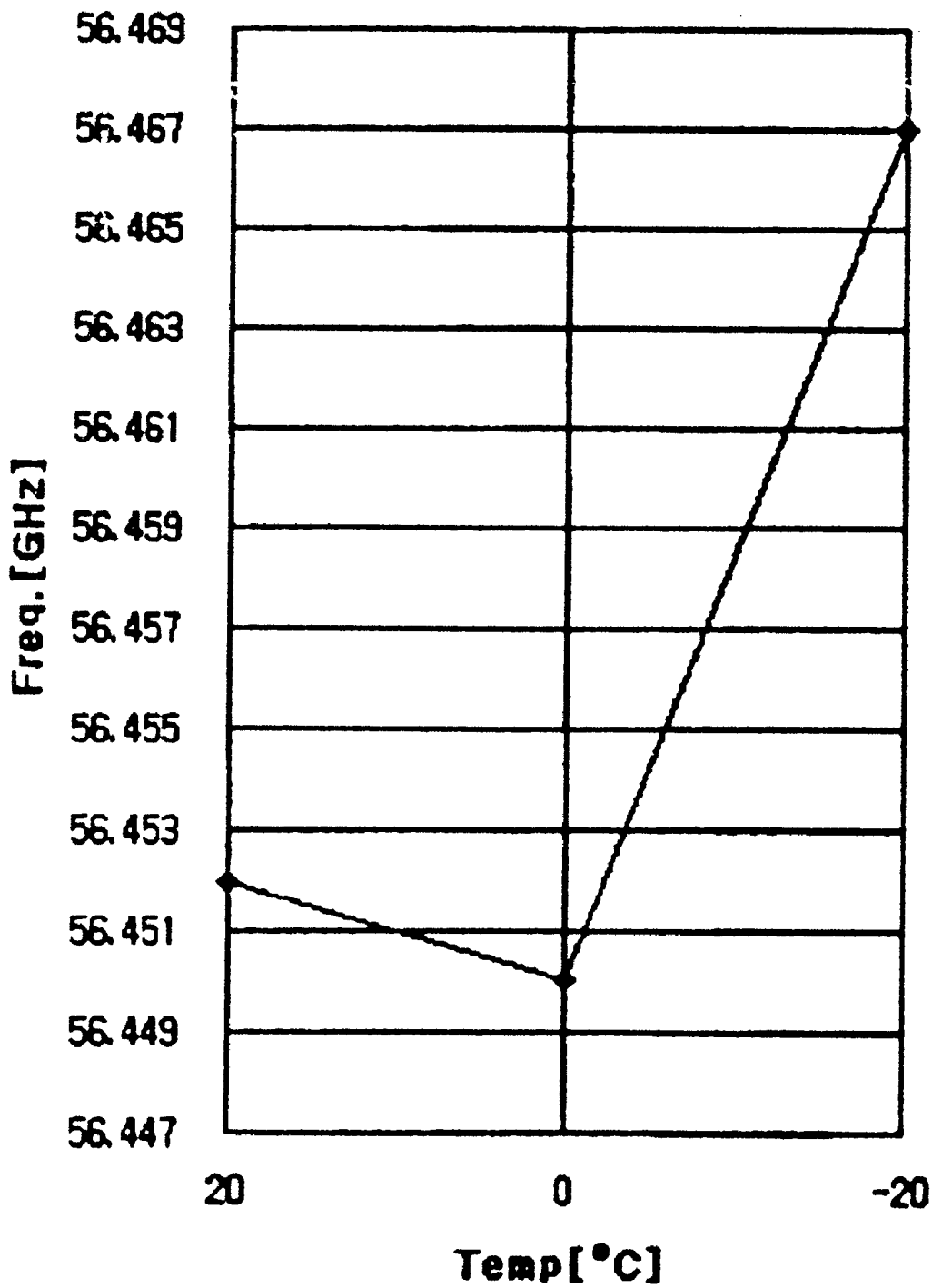

FIGS. 22a and 22b are graphs showing the result of a heat impact test to the DUT. The graphs illustrate the variation of the oscillating frequency of the oscillating signal when a temperature rapidly increases or decreases. When the temperature rapidly increases by 30° C., the oscillating frequency is reduced by 74 MHz, and when the temperature rapidly decreases by 20° C., the oscillating frequency increases by 17 MHz. It is understood from the heat impact test that, when the local oscillator of the present invention is operated in an abnormal temperature condition caused by external factors, the oscillating frequency is more stable when the temperature rapidly decreases than when the temperature rapidly increases.

Figure 23:
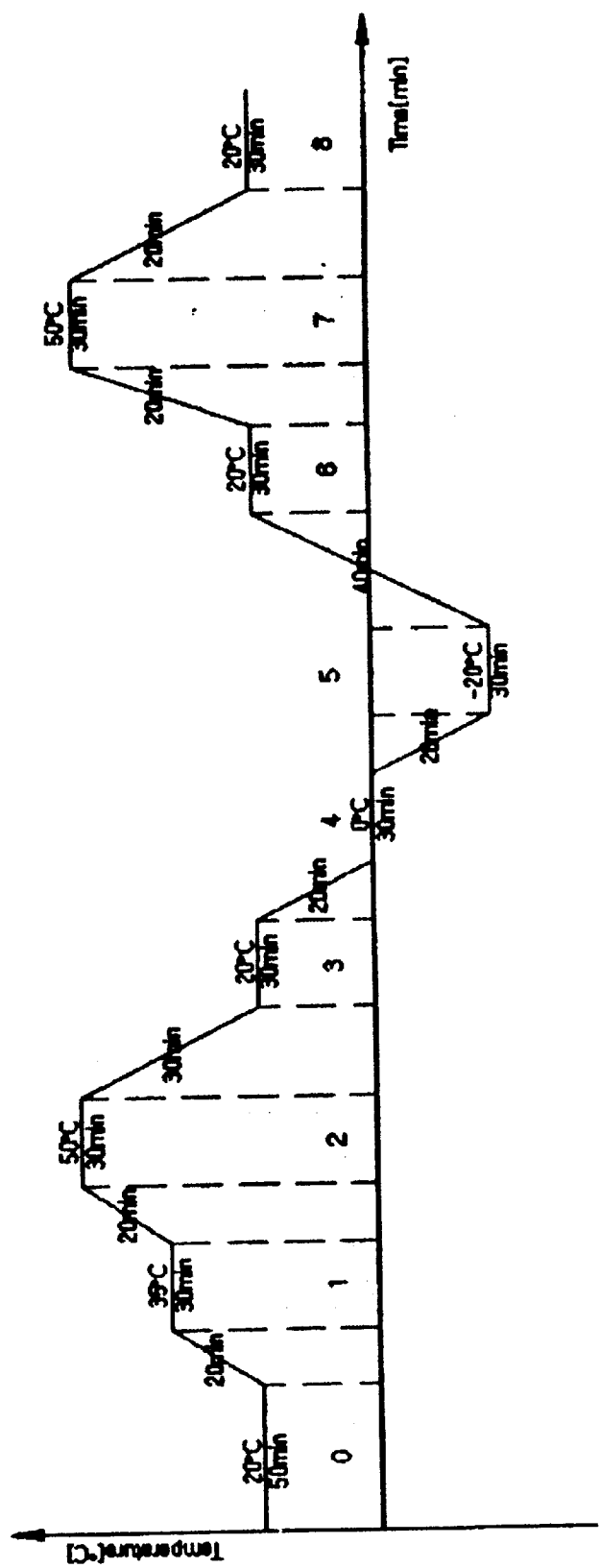
FIG. 23 is a view showing a setup layout for a temperature test of the local oscillator considering an atmosphere environment condition.
Figure 24:
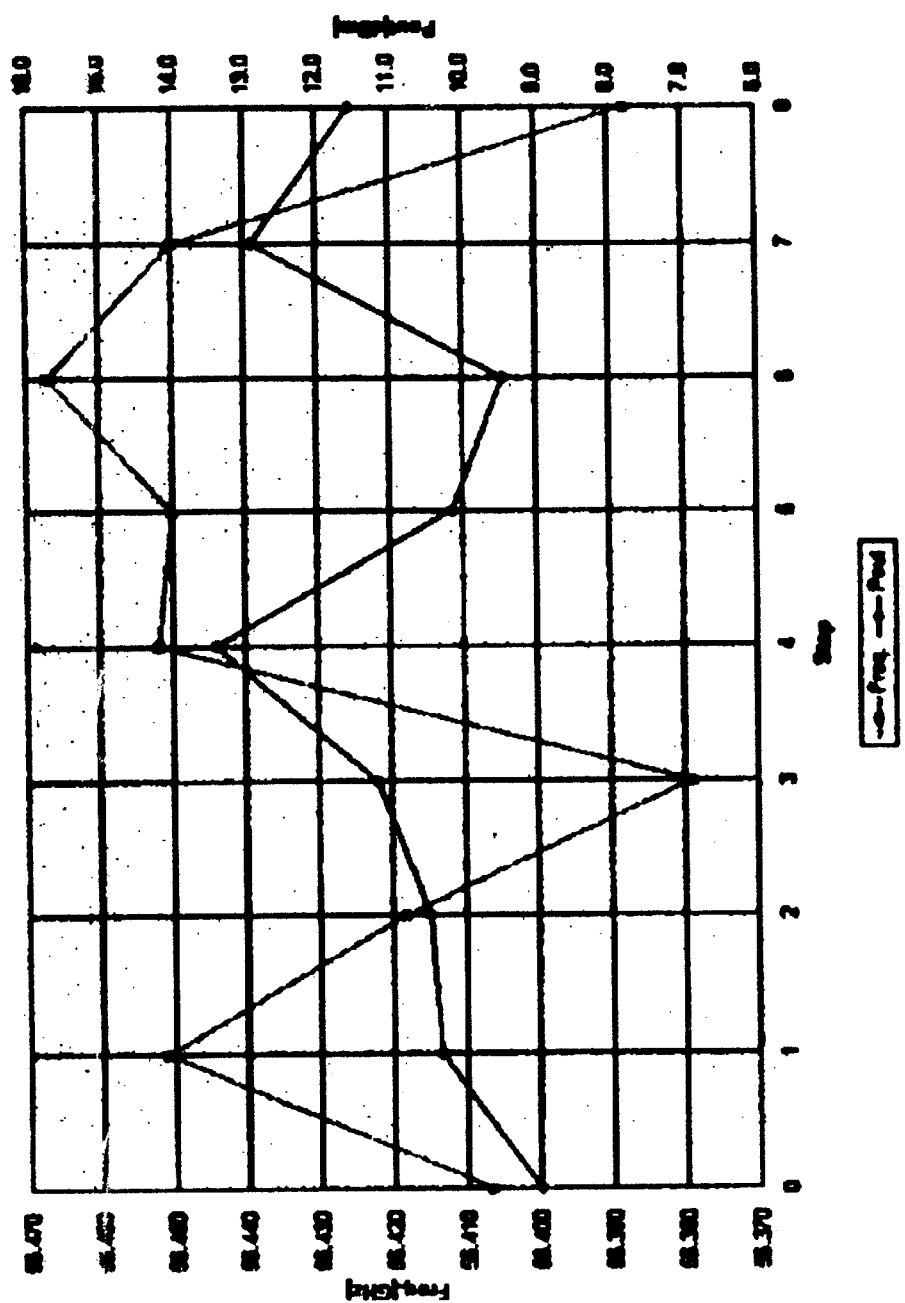
FIG. 24 is a graph obtained from the temperature test of the local oscillator.

FIG. 23 shows an example of a setup layout for a temperature test of the local oscillator in each step to test the variation of the oscillating signal of the DUT as a function of a temperature by using a temperature/wet-proof container an inner condition of which is prepared to be equivalent to a using air condition of the local oscillator. FIG. 24 is a graph obtained from the temperature test of the local oscillator. Under an operating environment condition of a telecommunication system equipped with the local oscillator of the present invention with a temperature range from −20° C. to 50° C., which is so-called an operating condition of an outdoor unit, the oscillating frequency changes at about 90 MHz and the oscillating power changes at about 4 dBm. In an ideal case, the oscillating power and the oscillating frequency have to be constantly maintained. However, in practice, the oscillating power and the oscillating frequency of the local oscillator can be changed by external factors. As is understood from the test result, the oscillating frequency of the local oscillator according to the present invention is relatively reduced when step 2 is changed to step 3 in FIG. 23. The frequency variation of the oscillating frequency is unwanted and it can be compensated by employing a phase locked loop.

Figure 25:
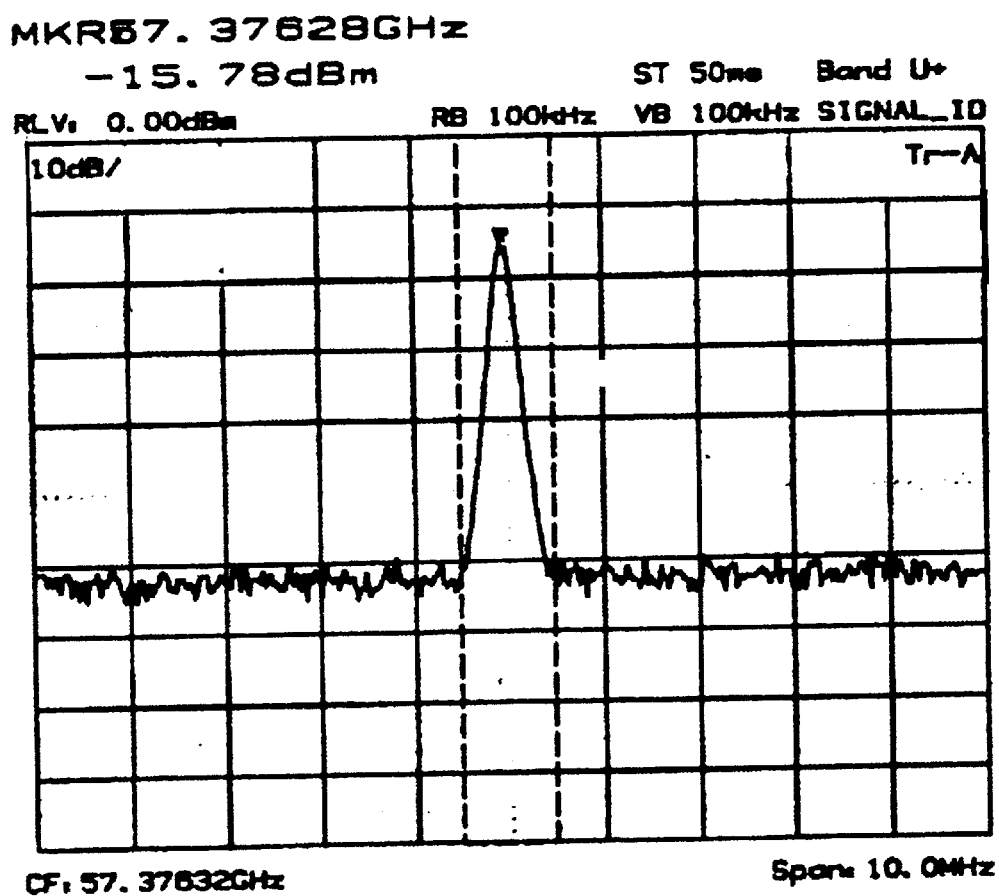
FIG. 25 is a graph showing the oscillating frequency and the oscillating power thereof by the millimeter wave local oscillator measured by a spectrum analyzer.

FIG. 25 is a graph showing the oscillating frequency and the oscillating power of the local oscillator measured by using a spectrum analyzer. In order to protect the spectrum analyzer, an attenuator having an attenuation value of 26 dB is installed at a front portion of the spectrum analyzer. According to a measurement, an oscillating signal of 10.22 dBm is obtained at an oscillating frequency of 57.376 GHz. By providing a proper impedance matching between the Gunn diode and the metal rod resonator, a phase noise below 45 dBc is achieved so that the stable millimeter wave oscillating signal can be generated.

Figure 26:
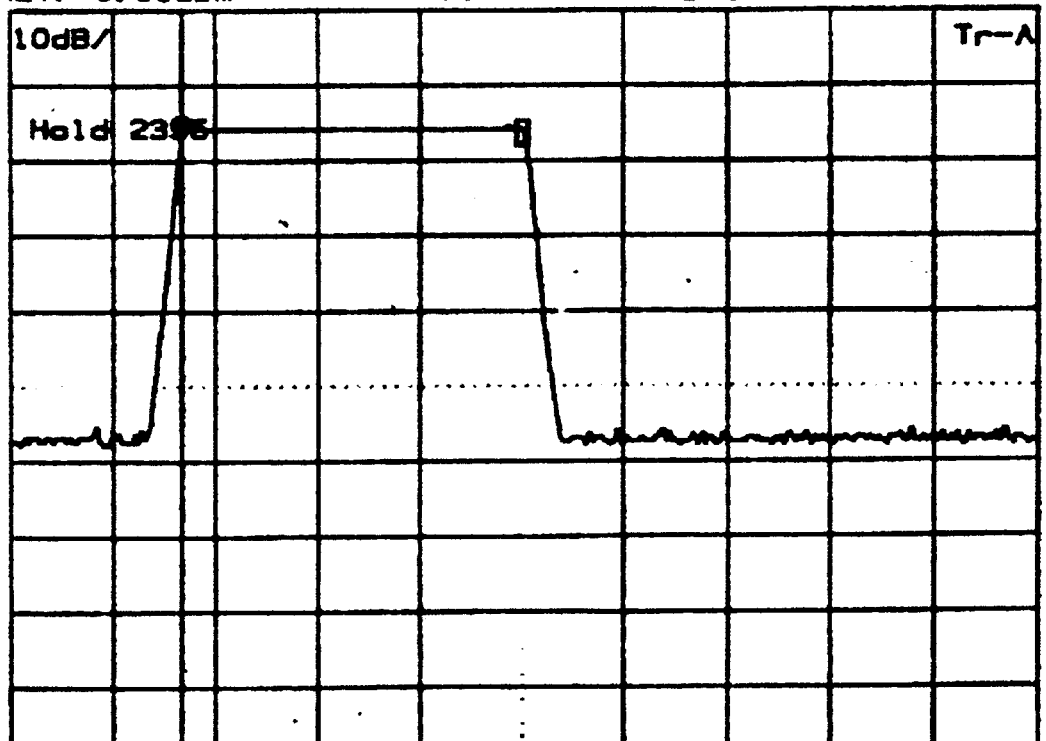
FIG. 26 is a graph showing pushing figures of a local oscillating output frequency.

FIG. 26 shows the pushing figure of the local oscillator which represents the variation of the oscillating frequency as a function of the bias voltage. A measured pushing figure is 2.79 MHz/V. It should be noted that the oscillating frequency can be controlled in a wide frequency range of 2.79 MHz by adjusting the bias voltage by 1 V, which represents the superior performance of the local oscillator of the present invention.

Figure 27:
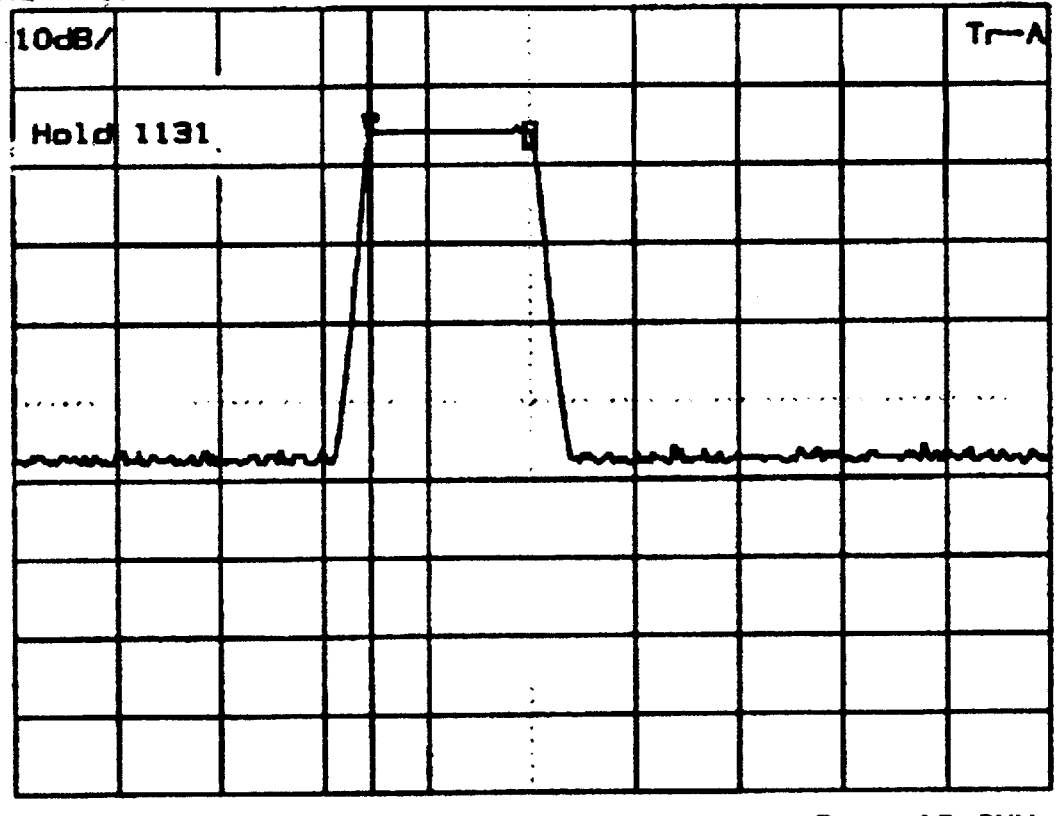
FIG. 27 is a graph showing a variation of the oscillating frequency for two hours after applying a bias.

FIG. 27 shows the variation of the oscillating frequency for two hours after applying a bias under a normal operating condition of the local oscillator of the present invention. Since the local oscillator acts as a signal source of the telecommunication system, the oscillating power and the oscillating frequency have to be stably maintained as soon as possible after applying the bias. In the conventional local oscillator, almost 1 hour is required until the local oscillator is stabilized. On the contrary, the local oscillator of the present invention can be stabilized within 30 minutes because the local oscillator of the present invention rapidly emits the heat by directly mounting the Gunn diode on the bottom of the housing.

Figure 28:
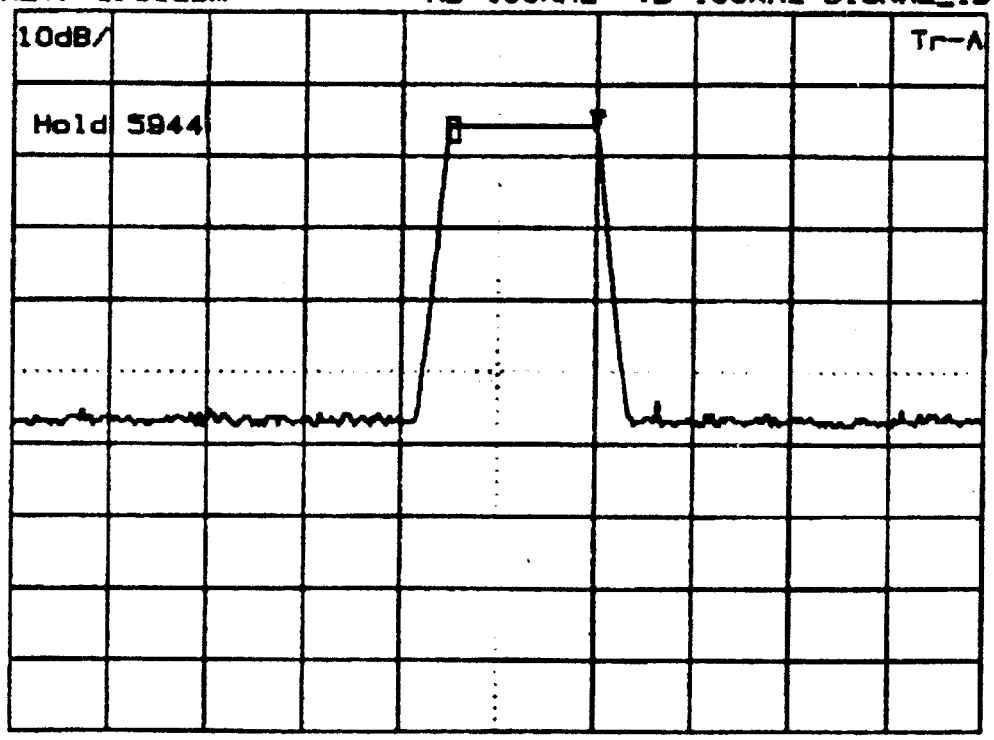
FIG. 28 is a graph showing a post tuning drift (PDT) of the millimeter wave local oscillator.

FIG. 28 is a graph showing the PDT of the local oscillator according to the present invention. The PDT is the variation of the oscillating frequency versus time which is measured while the local oscillator is situated under a normal operation condition which is obtained after a predetermined time from its initiation of operation. For the measurement, the local oscillator of the present invention has been operated for 3 hours. Then, the oscillating frequency is measured for next 3 hours and a mean value of the measured oscillating frequency is calculated. A measured value under this condition is 138 Hz/s which represents that the variation degree of the oscillating frequency is 138 Hz per second. It means that the local oscillator of the present invention is suitable for a millimeter wave signal source and is applicable to a telecommunication system.

The conventional local oscillator indirectly transfers the heat generated by the Gunn diode to the conductive housing, which acts as a heat sink, by mounting the Gunn diode in the diode mount, so that a discharge of the heat is delayed, thereby varying the oscillating power and the oscillating frequency. However, the local oscillator of the present invention directly transfers the heat to the conductive housing by directly installing the gun diode onto a bottom of the conductive housing so that the heat can be rapidly discharged. Accordingly, a temperature of the Gunn diode can be stably maintained so that the oscillating frequency and the oscillating power of the oscillating signal are stably maintained.

In addition, the local oscillator of the present invention does not require the diode mount, so time for manufacturing and assembling the local oscillator can be saved. Furthermore, the local oscillator of the present invention adopts a metal rod resonator, which is easily manufactured with a simple structure and has good power and frequency stability as compared with a microstrip resonator, so manufacturing costs of the local oscillator can be reduced. In addition, the local oscillator of the present invention includes a cavity forming member capable of protecting elements and tuning the frequency, so that the oscillating feature is improved and the oscillating signal having the desired oscillating frequency and the desired oscillating power is obtained.

Although the preferred embodiments of the invention have been described, it will be understood by those skilled in the art that the present invention should not be limited to the described preferred embodiments, but various changes and modifications can be made within the spirit and scope of the invention as defined by the appended claims.

What is claimed is:

1. A local oscillator comprising:
   a Gunn diode for generating an oscillating signal of millimeter wavelength by using a bias voltage;
   a resonating member for tuning a power of an oscillating signal and a frequency thereof;
   an NRD guide for guiding the oscillating signal inputted into an input terminal thereof to an output terminal thereof;
   an LSE mode suppressor inserted into the input terminal of the NRD guide, for preventing an LSE mode of the oscillating signal transferred from the resonating member from passing therethrough while allowing an LSM mode of the oscillating signal to pass therethrough; and
   a housing including an upper conductive plate and a lower conductive plate, for accommodating the Gunn diode, the resonating member, the NRD guide, the LSE mode suppressor therewithin;
   wherein the Gunn diode is vertically buried in a first coupling hole formed at a bottom of the lower conductive plate such that an anode thereof is exposed to an exterior so as to directly transfer a heat generated from the Gunn diode to the lower conductive plate; and
   wherein the resonating member includes a fixing block which is installed to be in contact with the input terminal of the NRD guide and is formed with a second coupling hole, and a metal rod resonator which is inserted into the fixing block to be arranged in perpendicular to a length direction of the NRD guide, and one end thereof being exposed to make direct contact with an anode of the Gunn diode.

2. The local oscillator as claimed in claim 1, wherein the Gunn diode is screw-coupled into the first coupling hole.

3. The local oscillator as claimed in claim 1, where the fixing block is press-fitted into a mounting groove formed at the lower conductive plate.

4. The local oscillator as claimed in claim 1, wherein an end of the metal rod resonator and the anode of the Gunn diode are directly coupled to each other by soldering.

5. A local oscillator comprising:
   a Gunn diode for generating an oscillating signal of millimeter wavelength by using a bias voltage;

a resonating member for tuning a power of an oscillating signal and a frequency thereof;

an NRD guide for guiding the oscillating signal inputted into an input terminal thereof to an output terminal thereof;

an LSE mode suppressor inserted into the input terminal of the NRD guide, for preventing an LSE mode of the oscillating signal transferred from the resonating member from passing therethrough while allowing an LSM mode of the oscillating signal to pass therethrough; and a housing including an upper conductive plate and a lower conductive plate, for accommodating the Gunn diode, the resonating member, the NRD guide, the LSE mode suppressor therewithin;

wherein the Gunn diode is vertically buried in a first coupling hole formed at a bottom of the lower conductive plate such that an anode thereof is exposed to an exterior so as to directly transfer a heat generated from the Gunn diode to the lower conductive plate;

further comprising a bias choke which rejects a harmonic component of a bias power supplied from a bias feeding through so as to transfer a DC bias into the Gunn diode, the bias choke being fabricated by etching a thin copper film in a form of a microstrip and being arranged in parallel on the lower conductive plate, the bias feeding through and the Gunn diode being coupled to each other by a wire.

6. The local oscillator as claimed in claim 5, further comprising a cavity forming member which is installed in the housing for stabilizing the power of the oscillating signal and the frequency thereof, the cavity forming member being formed with an opening through which the NRD guide passes and defining a cavity which surrounds the input terminal of the NRD guide, the Gunn diode, the resonating member and the mode suppressor.

7. The local oscillator as claimed in claim 6, wherein the cavity forming member is formed at a bottom thereof with a bias choke passing groove, the bias choke being positioned in a space defined by the lower conductive plate and the groove.

8. The local oscillator as claimed in claim 6, wherein a $\lambda/4$ groove is formed on a bottom of the cavity forming member along a length direction thereof to reduce a leaky wave of the housing.

9. The local oscillator as claimed in claim 6, wherein the cavity forming member and the lower conductive plate are assembled with screws for tuning the frequency by screw-coupling the screws into screw holes which are respectively formed at corresponding locations of the cavity forming member and the lower conductive plate.

10. A local oscillator comprising:

a Gunn diode for generating an oscillating signal of millimeter wavelength by using a bias voltage;

a resonating member for tuning a power of an oscillating signal and a frequency thereof;

an NRD guide for guiding the oscillating signal inputted into an input terminal thereof to an output terminal thereof;

an LSE mode suppressor inserted into the input terminal of the NRD guide, for preventing an LSE mode of the oscillating signal transferred from the resonating member from passing therethrough while allowing an LSM mode of the oscillating signal to pass therethrough;

a housing including an upper conductive plate and a lower conductive plate, for accommodating the Gunn diode, the resonating member, the NRD guide, the LSE mode suppressor therewithin; and a cavity forming member installed in the housing for stabilizing the oscillating signal, the cavity forming member being formed with an opening through which the NRD guide passes and defining a cavity which surrounds the input terminal of the NRD guide, the Gunn diode, the resonating member and the mode suppressor;

wherein the cavity forming member and the lower conductive plate are assembled with screws for tuning the frequency by screw-coupling the screws into screw holes which are respectively formed at corresponding locations of the cavity forming member and the lower conductive plate.

11. The local oscillator as claimed in claim 10, wherein a $\lambda/4$ groove is formed on a bottom of the cavity forming member along a length direction thereof to reduce a leaky wave of the housing.

12. The local oscillator as claimed in claim 10, wherein the cavity forming member is formed at a bottom thereof with a passing groove for a bias choke which is positioned in a space defined by the lower conductive plate and the passing groove and rejects a harmonic component of a bias current to provide a DC bias to the Gunn diode as the bias voltage for driving the Gunn diode.

13. A local oscillator comprising:

a Gunn diode for generating an oscillating signal of millimeter wavelength by using a bias voltage;

a resonating member for tuning a power of an oscillating signal and a frequency thereof;

an NRD guide for guiding the oscillating signal inputted into an input terminal thereof to an output terminal thereof;

an LSE mode suppressor inserted into the input terminal of the NRD guide, for preventing an LSE mode of the oscillating signal transferred from the resonating member from passing therethrough while allowing an LSM mode of the oscillating signal to pass therethrough;

a cavity forming member formed with an opening through which the NRD guide passes for defining a cavity which surrounds the input terminal of the NRD guide, the Gunn diode, the resonating member and the mode suppressor; and a housing including an upper conductive plate and a lower conductive plate, for accommodating the Gunn diode, the resonating member, the NRD guide, the LSE mode suppressor and the cavity forming member therewithin, wherein the resonating member includes a fixing block which is installed to be in contact with the input terminal of the NRD guide an is formed with a second coupling hole, and a metal rod resonator which is inserted into the fixing block to be arranged in perpendicular to a length direction of the NRD guide, one end thereof being exposed to make direct contact with an anode of the Gunn diode; and the cavity forming member and the lower conductive plate are assembled with screws for tuning the frequency by screw-coupling the screws into screw holes which are respectively formed at corresponding locations of the cavity forming member and the lower conductive plate.

14. The local oscillator as claimed in claim 13, wherein a $\lambda/4$ groove is formed on a bottom of the cavity forming member along a length direction thereof to reduce a leaky wave of the housing.

15. The local oscillator as claimed in claim 13, wherein the fixing block is press-fitted into a mounting groove formed at the lower conductive plate.

16. The local oscillator as claimed in claim 13, wherein the Gunn diode is vertically buried in a first coupling hole formed at a bottom of the lower conductive plate such that an anode thereof is exposed to an exterior so as to directly transfer a heat generated from the Gunn diode to the lower conductive plate.

* * * * *